(12) United States Patent
Yakopcic et al.

(10) Patent No.: US 10,346,738 B2
(45) Date of Patent: Jul. 9, 2019

(54) ANALOG NEUROMORPHIC CIRCUITS FOR DOT-PRODUCT OPERATION IMPLEMENTING RESISTIVE MEMORIES

(71) Applicant: University of Dayton, Dayton, OH (US)

(72) Inventors: Chris Yakopcic, Dayton, OH (US); Tarek M. Taha, Centerville, OH (US); Md Raqibul Hasan, Baltimore, MD (US)

(73) Assignee: University of Dayton, Dayton, OH (US)

( * ) Notice: Subject to any disclaimer, the term of this patent is extended or adjusted under 35 U.S.C. 154(b) by 0 days.

(21) Appl. No.: 16/242,146

(22) Filed: Jan. 8, 2019

(65) Prior Publication Data

US 2019/0138894 A1 May 9, 2019

Related U.S. Application Data

(63) Continuation of application No. 15/650,145, filed on Jul. 14, 2017, now Pat. No. 10,176,425.
(Continued)

(51) Int. Cl.
*G06N 3/063* (2006.01)
*G11C 11/54* (2006.01)
(Continued)

(52) U.S. Cl.
CPC .......... *G06N 3/0635* (2013.01); *G06F 17/10* (2013.01); *G11C 11/54* (2013.01); *G11C 13/004* (2013.01); *G11C 13/0021* (2013.01)

(58) Field of Classification Search
CPC ....... G06N 3/0635; G06F 17/10; G11C 11/54; G11C 13/0021
(Continued)

(56) References Cited

U.S. PATENT DOCUMENTS 5,530,393 A 6/1996 Guerrieri et al.
5,592,418 A 1/1997 Sabatini et al.
(Continued)

OTHER PUBLICATIONS

Chabi et al., "Robust Neural Logic Block (NLB) Based on Memristor Crossbar Array" IEEE/ACM International Symposium on Nanoscale Architectures, pp. 137-143, 2011.
(Continued)

*Primary Examiner* — Harry W Byrne
(74) *Attorney, Agent, or Firm* — Taft Stettinius & Hollister LLP

(57) ABSTRACT

An analog neuromorphic circuit is disclosed having resistive memories that provide a resistance to each corresponding input voltage signal. Input voltages are applied to the analog neuromorphic circuit. Each input voltage represents a vector value that is a non-binary value included in a vector that is incorporated into a dot-product operation with weighted matrix values included in a weighted matrix. A controller pairs each resistive memory with another resistive memory. The controller converts each pair of resistance values to a single non-binary value. Each single non-binary value is mapped to a weighted matrix value included in the weighted matrix that is incorporated into the dot-product operation with the vector values included in the vector. The controller generates dot-product operation values from the dot-product operation with the vector and the weighted matrix where each dot-product operation is a non-binary value.

13 Claims, 14 Drawing Sheets

Related U.S. Application Data

(60) Provisional application No. 62/366,379, filed on Jul. 25, 2016, provisional application No. 62/362,379, filed on Jul. 14, 2016.

(51) Int. Cl.
*G06F 17/10* (2006.01)
*G11C 13/00* (2006.01)

(58) Field of Classification Search
USPC .......... 365/46, 94, 100, 129, 148, 158, 163; 257/2–5, 9, 295, 310, E21.35; 438/95, 438/96, 135, 166, 240, 365, 482, 486, 438/597, 785
See application file for complete search history.

(56) References Cited

U.S. PATENT DOCUMENTS

| | | | |
|---|---|---|---|
| 7,398,259 B2 | 7/2008 | Nugent | |
| 8,274,312 B2 | 9/2012 | Pino et al. | |
| 8,872,246 B1* | 10/2014 | Stevens | H01L 45/08 257/2 |
| 8,954,363 B2 | 2/2015 | Heliot et al. | |
| 9,412,940 B2 | 8/2016 | Sacchetto et al. | |
| 9,520,445 B2* | 12/2016 | Schmidt | H01L 45/1206 |
| 2011/0004579 A1 | 1/2011 | Snider | |
| 2012/0084241 A1 | 4/2012 | Friedman et al. | |
| 2012/0317063 A1 | 12/2012 | Sim et al. | |
| 2013/0103626 A1 | 4/2013 | Hunzinger | |
| 2013/0117213 A1 | 5/2013 | Hunzinger et al. | |
| 2013/0311413 A1 | 11/2013 | Rose et al. | |
| 2013/0325775 A1 | 12/2013 | Sinyavskiy et al. | |
| 2014/0052679 A1 | 2/2014 | Sinyavskiy et al. | |
| 2014/0122402 A1 | 5/2014 | Bichler et al. | |
| 2014/0129498 A1 | 5/2014 | Bichler et al. | |
| 2014/0312400 A1* | 10/2014 | Schmidt | H01L 45/1206 257/295 |
| 2016/0284400 A1 | 9/2016 | Yakopcic et al. | |
| 2016/0336064 A1 | 11/2016 | Seo et al. | |
| 2016/0370682 A1* | 12/2016 | Han | G02F 1/157 |

OTHER PUBLICATIONS

Zamarreno-Ramos et al., "On spike-timing-dependent-plasticity, memristive devices, and building a self-learning visual vortex," Frontiers in Neuroscience, Neuromorphic Engineering, vol. 5, pp. 1-22, Article 26, Mar. 2011.

Jo et al., "High-Density Crossbar Arrays Based on a Si Memristive System" Nano Letters, 9(2), 2009, pp. 870-874.

Alibart et al., "Pattern classification by memristive crossbar circuits with ex-situ and in-situ training", Nature communications, 4:2072, Jun. 2013.

Taha et al., "Neuromorphic algorithms on clusters of PlayStation 3s," International Joint Conference on Neural Networks (IJCNN), pp. 1-10, Jul. 18-23, 2010.

Dubey, "Recognition, mining and synthesis moves computers to the era of tera," Technology@Intel Magazine, Feb. 2005.

Esmaeilzadeh et al., "Neural Acceleration for General-Purpose Approximate Programs," International Symposium on Microarchitecture (MICRO), 2012.

Esmaeilzadeh et al., "Towards Neural Acceleration for General-Purpose Approximate Computing," Workshop on Energy Efficient Design (WEED), 2012.

Chua, "Memristor—The Missing Circuit Element," IEEE Transactions on Circuit Theory, 18(5), 507-519 (1971).

Strukov et al., "The missing Memristor found," Nature, 453, 80-83 (2008).

Snider, "Cortical Computing with Memristive Nanodevices," SciDAC Review, 58 (2008).

Nageswaran et al., "Efficient Simulation of Large-Scale Spiking Neural Networks Using CUDA Graphics Processors," In Proceedings of 2009 International Joint Conference on Neural Networks (IJCNN). IEEE Press, Piscataway, NJ, USA, pp. 3201-3208, 2009.

Han et al., "Accelaration of spiking neural network based pattern recognition on NVIDIA graphics processors," Journal of Applied Optics, 49(101), pp. 83-91, 2010.

\* cited by examiner

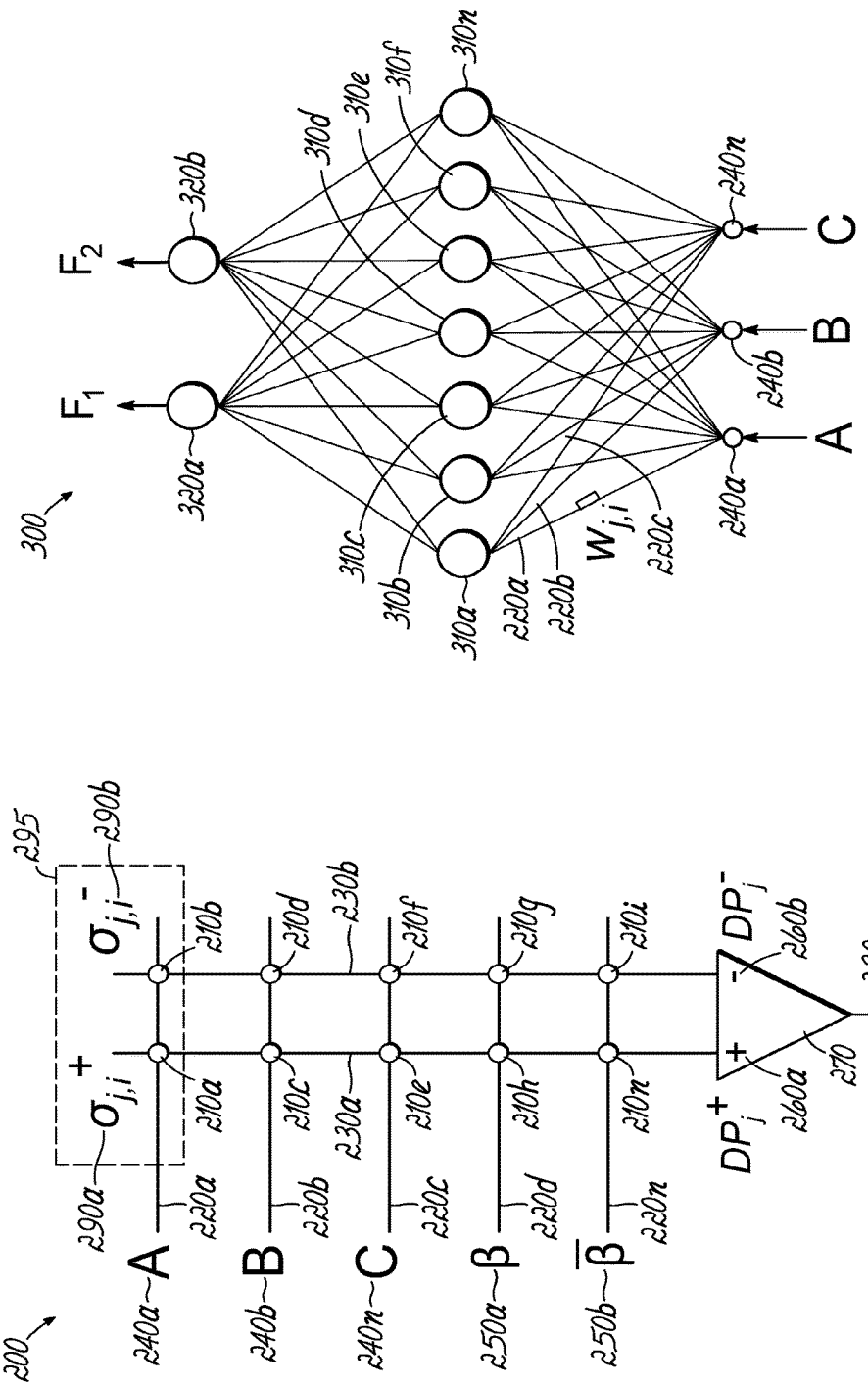

ANALOG NEUROMORPHIC CIRCUITS FOR DOT-PRODUCT OPERATION IMPLEMENTING RESISTIVE MEMORIES

RELATED APPLICATIONS

The present application is a continuation of U.S. Non-provisional application Ser. No. 15/650,145 which claims the benefit of and priority to U.S. Provisional Patent Application No. 62/362,379 filed on Jul. 14, 2016 and U.S. Provisional Patent Application 62/366,379 filed on Jul. 25, 2016, the disclosures of which are both incorporated by reference in their entirety.

FIELD OF THE INVENTION

This invention relates to neural networks, and more particularly, to systems and methods for implementing resistive memories in an analog neuromorphic circuit.

BACKGROUND OF THE INVENTION

Traditional computing systems use conventional microprocessor technology in that operations are performed in chronological order such that each operation is completed before the subsequent operation is initiated. The operations are not performed simultaneously. For example, an addition operation is completed before the subsequent multiplication operation is initiated. The chronological order of operation execution limits the performance of conventional microprocessor technology. Conventional microprocessor design is limited in how small the microprocessors can be designed, the amount of power that the microprocessors consume, as well as the speed in which the microprocessors execute operations in chronological order. Thus, conventional microprocessor technology is proving insufficient in applications that require high computation power, such as in image recognition.

It is becoming common wisdom to use conventional neuromorphic computing networks which are laid out in a similar fashion as the human brain. Hubs of computing power are designed to function as a neuron in the human brain where different neurons of computing power are coupled to other neurons of computing power. This coupling of neurons enables the neuromorphic computing network to execute multiple operations simultaneously. Therefore, the neuromorphic computing network has exponentially more computing power than traditional computing systems.

Conventional neuromorphic computing networks are implemented in large scale computer clusters which include computers that are physically large in order to attain the computation power necessary to execute applications such as image recognition. For example, applications of these large scale computer clusters include rows and rows of physically large servers that may attain the computation power necessary to execute image recognition when coupled together to form a conventional neuromorphic computing network. Such large scale computer clusters not only take up a significant amount of physical space but also require significant amounts of power to operate.

The significant amount of physical space and power required to operate conventional neuromorphic computing networks severely limits the types of applications for which conventional neuromorphic computing networks may be implemented. For example, industries such as biomedical, military, robotics, and mobile devices are industries that cannot implement conventional neuromorphic computing networks due to the significant space limitations in such industries as well as the power limitations. Therefore, an effective means to decrease the space and the power required by conventional neuromorphic computing is needed.

SUMMARY OF THE INVENTION

The present invention provides an analog neuromorphic circuit that implements a plurality of resistive memories, a plurality of input voltages and a controller. A plurality of input voltages is applied to the analog neuromorphic circuit. Each input voltage represents a vector value that is a non-binary value included in a vector that is incorporated into a dot-product operation with a plurality of matrix values included in a matrix. Each resistive memory is configured to provide a resistance value to each corresponding input voltage. Each resistance value is a positive resistance value selected from a finite range of resistance values. The controller is configured to pair each resistive memory with another resistive memory so that each pair of resistive memories includes a pair of resistance values. The controller is also configured to convert each pair of resistance values from a pair of resistance values selected from the finite range of resistance values to a single non-binary value. Each single non-binary value is mapped to a matrix value included in the matrix that is incorporated into the dot-product operation with the vector values included in the vector. The controller is also configured to generate a plurality of dot-product operation values from the dot-product operation with the vector and the matrix where each dot-product operation value is a non-binary value.

The present invention also provides a method for adjusting resistances of a plurality of resistive memories positioned in an analog neuromorphic circuit. The method starts with applying input voltages to the analog neuromorphic circuit. Each input voltage represents a vector value that is a non-binary value included in a vector that is incorporated into a dot-product operation with a plurality of matrix values included in a matrix. The method further includes providing a resistance value to each corresponding input voltage from a corresponding resistance memory included in a plurality of resistive memories. Each resistance value is a positive resistance value selected from a finite range of resistance values. The method further includes pairing each resistive memory with another resistive memory from the plurality of resistive memories so that each pair of resistive memories includes a pair of resistance values. The method further includes converting each pair of resistance values from a pair of resistance values selected from the finite range of resistance values to a single non-binary value. The method further includes mapping each single non-binary value to a matrix value included in the matrix that is incorporated into the dot-product operation with the vector values included in the vector. The method further includes generating dot-product operation values from the dot-product operation with the vector and the matrix. Each dot-product operation value is a non-binary value.

The present invention also provides an analog neuromorphic system that implements a plurality of resistive memories, a plurality of input voltages, and a controller. The input voltages are applied to the analog neuromorphic circuit. Each input voltage represents an image value that is a non-binary value included in an image matrix that is converted into a voltage vector. Each resistive memory is configured to provide a resistance value to each corresponding input voltage. Each resistance value is mapped to a corresponding kernel value that is a non-binary value included in a kernel matrix. A controller is configured to convert each image value included in the image matrix into the corresponding input voltage that is included in a voltage vector. The controller is also configured to map each corresponding kernel value to a corresponding resistance value associated with a corresponding resistive memory. The controller is also configured to generate a plurality of filtered image values from a dot-product operation with the image matrix represented by the plurality of input voltages and the kernel matrix represented by each resistance value associated with each of the resistive memories where the filtered image values depict a filtered image.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

FIG. 2 is a schematic illustration of an exemplary analog neuromorphic circuit that simultaneously executes several computing operations in parallel in accordance with an embodiment of the disclosure;

FIG. 3 is a schematic illustration of an exemplary neural network configuration that the analog neuromorphic circuit of FIG. 1 may be implemented and scaled in accordance with an embodiment of the disclosure;

DETAILED DESCRIPTION

Figure 1:
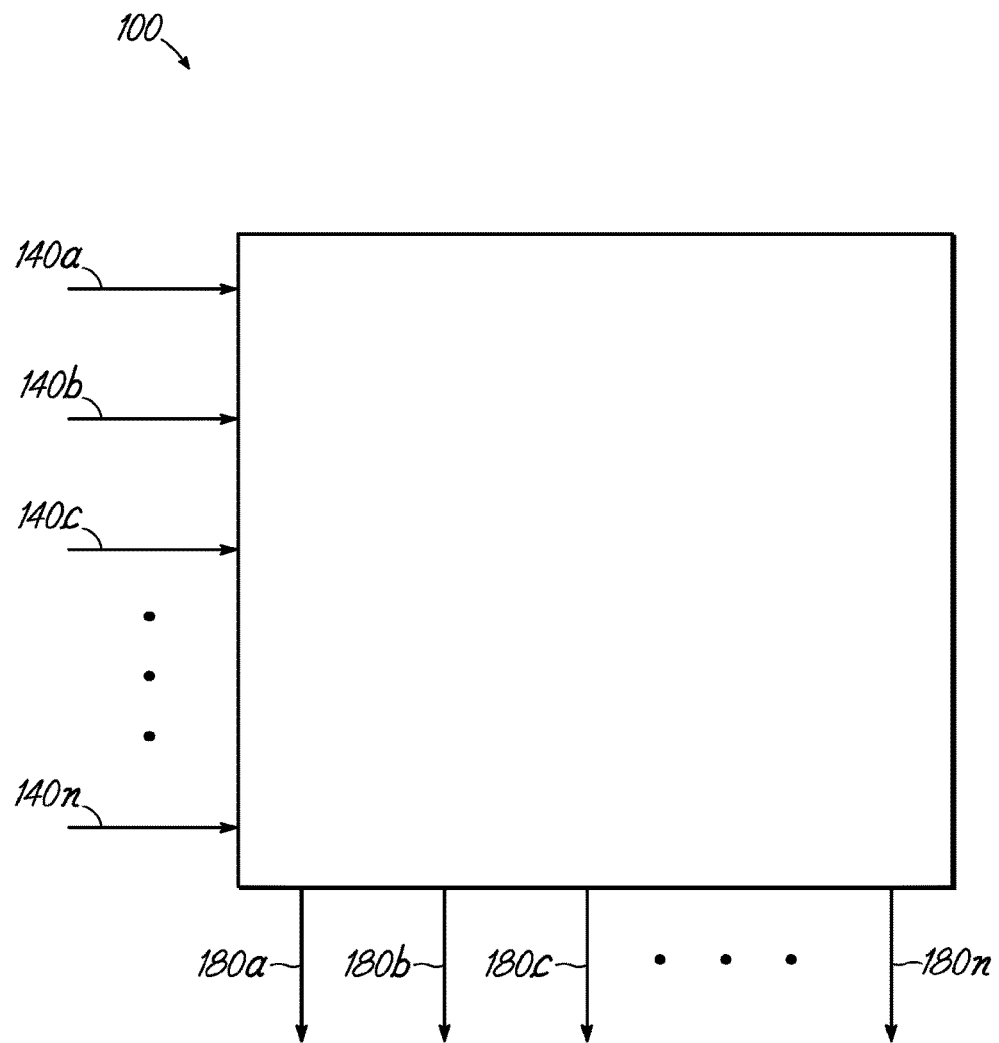
FIG. 1 is a schematic illustration of exemplary analog neuromorphic processing device that simultaneously executes several computing operations in parallel in accordance with an embodiment of the disclosure.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

The present invention creates an analog neuromorphic computing network by implementing resistive memories. A resistive memory is a non-volatile, variable resistor that may not only change the resistance level but may also maintain the resistance level after power to the resistive memory has been terminated so that the resistive memory acts as memory. The resistive memory may also have resistances that are positive and negative. In an embodiment, an equivalent of a negative resistance generated by a resistive memory may be generated by implementing negative weight values with a pair of resistive memories. The output of one of the resistive memories from the pair may then be inverted by an inverting circuit. Such characteristics of the resistive memory enables neuromorphic computing to be shrunk down from implementing large computers to a circuit that can be fabricated onto a chip while requiring minimal power due to the analog characteristics of the resistive memory.

The resistive memories may be positioned in a crossbar configuration in that each resistive memory is positioned at an intersection of a plurality of horizontal wires and a plurality of vertical wires forming a wire grid. An input voltage may be applied to each horizontal wire. Each resistive memory may apply a resistance to each input voltage so that each input voltage is multiplied by each resistance. The positioning of each resistive memory at each intersection of the wire grid enables the multiplying of each input voltage by the resistance of each resistive memory to be done in parallel. The multiplication in parallel enables multiple multiplication operations to be executed simultaneously. Each current relative to each horizontal wire may then be added to generate an accumulative current that is conducted by each vertical wire. The addition of each current to generate the accumulative currents is also done in parallel due to the positioning of the resistive memories at each intersection of the wire grid. The addition in parallel also enables multiple addition operations to be executed simultaneously. The simultaneous execution of addition and multiplication operations in an analog circuit generates significantly more computation power than conventional microprocessors while implementing significantly less power than conventional microprocessors.

The terms "horizontal" and "vertical" are used herein for ease of discussion to refer to one example of the invention. It should be understood however that such orientation is not required, nor is a perpendicular intersection required. It is sufficient that a plurality of parallel wires intersects a pair of parallel wires to form a crossbar or grid pattern having two wires for adding current and two or more wires for inputting voltages, with a resistive memory positioned at each intersection for multiplication. The intersections may occur at right angles (orthogonal crossing lines) or non-right angles. It may be understood, however, that the orthogonal arrangement provides the simplest means for scaling the circuit to include additional neurons and/or layers of neurons. Further, it may be understood that an orientation having horizontal rows and/or vertical columns is also simpler for scaling purposes and is a matter of the point of reference, and should not be considered limiting. Thus, any grid configuration orientation is contemplated.

Referring to FIG. 1, an analog neuromorphic processing device 100 simultaneously executes several computing operations in parallel. The analog neuromorphic processing device 100 includes a plurality of input voltages 140(*a-n*) that are applied to a plurality of respective inputs of the analog neuromorphic processing device 100 and the analog neuromorphic processing device 100 then generates a plurality of output signals 180(*a-n*).

The analog neuromorphic processing device 100 may include a plurality of resistive memories (not shown) that have variable resistance characteristics that may be exercised not only with low levels of power but may also exercise those variable resistance characteristics after power applied to the resistive memories has been terminated. The variable resistance characteristics of the resistive memories enable the resistive memories to act as memory while maintaining significantly low power requirements compared to conventional microprocessors. The resistive memories are also of nano-scale sizes that enable a significant amount of resistive memories to be configured within the analog neuromorphic processing device 100 while still maintaining significantly low power level requirements. The variable resistance capabilities of the resistive memories coupled with the nano-scale size of the resistive memories enable the resistive memories to be configured so that the analog neuromorphic processing device 100 has significant computational efficiency while maintaining the size of the analog neuromorphic processing device 100 to a chip that may easily be positioned on a circuit board.

For example, the resistive memories may include but are not limited to memristors that are nano-scale variable resistance devices with a significantly large variable resistance range. The physics of the resistive memories, such as memristors, require significantly low power and occupy little space so that the resistive memories may be configured in the analog neuromorphic processing device 100 to generate significant computational efficiency from a small chip.

The plurality of input voltages 140(*a-n*), where n is an integer greater than or equal to one, may be applied to corresponding inputs of the analog neuromorphic processing device 100 to exercise the variable resistance characteristics of the resistive memories. The input voltages 140(*a-n*) may be applied at a voltage level and for a time period that is sufficient to exercise the variable resistance characteristics of the resistive memories. The input voltages 140(*a-n*) may vary and/or be substantially similar depending on the types of variable resistance characteristics that are to be exercised by each of the resistive memories.

The resistive memories may be arranged in the analog neuromorphic processing device 100 such that the resistive memories may simultaneously execute multiple addition and multiplication operations in parallel in response to the input voltages 140(*a-n*) being applied to the inputs of the analog neuromorphic processing device 100. The variable resistance characteristics of the resistive memories as well as their nano-scale size enables a significant amount of resistive memories to be arranged so that the input voltages 140(*a-n*) trigger responses in the resistive memories that are then propagated throughout the analog neuromorphic processing device 100 that results in simultaneous multiplication and addition operations that are executed in parallel.

The simultaneous multiplication and addition operations executed in parallel exponentially increase the efficiency of analog neuromorphic processing device 100 while limiting the power required to obtain such computation capabilities to the input voltages 140(*a-n*). The resistive memories are passive devices so that the simultaneous multiplication and addition operations executed in parallel are performed in the analog domain, which also exponentially decreases the required power. For example, the analog neuromorphic processing device 100 may have significantly more computational efficiency than traditional microprocessor devices, and may be smaller than traditional microprocessor chips while reducing power in a range from 1,000 times to 1,000,000 times that of traditional microprocessors.

The resistive memories may also be arranged such that the simultaneous execution of the multiplication and addition operations in parallel may be configured as a single computation hub that constitutes a single neuron in a neural network. The variable resistance characteristics and the nano-scale size of the resistive memories further enable the arrangement of resistive memories to be scaled with other arrangements of resistive memories so that the single neuron may be scaled into a neural network including multiple neurons. The scaling of a single neuron into multiple neurons exponentially further increases the computational efficiency of the resulting neural network. In addition, the multiple neurons may be scaled into several layers of neurons that further exponentially increases the computational efficiency of the neural network. The scaling of the resistive memories into additional neurons may be done within the analog neuromorphic processing device 100 such as within a single chip. However, the analog neuromorphic processing device 100 may also be scaled with other analog neuromorphic circuits contained in other chips to exponentially increase the computational efficiency of the resulting neural network.

As a result, the analog neuromorphic processing device 100 may be configured into a neural network that has the capability of executing applications with significant computational efficiency, such as image recognition. For example, the output signals 180(*a-n*), where n is an integer greater than or equal to one, may generate signals that correctly identify an image. The analog neuromorphic processing device 100 may also have the learning capability as will be discussed in further detail below so that analog neuromorphic circuits may successfully execute learning neural network algorithms.

The analog neuromorphic processing device 100 implemented as a single neuron and/or multiple neurons in a neural network and/or configured with other similar analog neuromorphic processing devices 100 may have significant advantages in traditional computing platforms that require significant computational efficiency with limited power resources and space resources. For example, such traditional computing platforms may include but are not limited to Fast Fourier Transform (FFT) applications, Joint Photographic Experts Group (JPEG) image applications, and/or recognition, mining, and synthesis (RMS) applications. The implementation of low power neural networks that have a limited physical footprint may also enable this type of computational efficiency to be utilized in many systems that have traditionally not been able to experience such computational efficiency due to the high power consumption and large physical footprint of conventional computing systems. Such systems may include but are not limited to military and civilian applications in security (image recognition), robotics (navigation and environment recognition), and/or medical applications (artificial limbs and portable electronics).

The layering of the analog neuromorphic processing device 100 with other similar analog neuromorphic circuits may enable complex computations to be executed. The compactness of the resistive memory configurations enables fabrication of chips with a high synaptic density in that each chip may have an increased amount of neurons that are fitted onto the chip. The passive characteristics of the resistive memories eliminate the need for software code which increases the security of the analog neuromorphic processing device 100.

Referring to FIG. 2, an analog neuromorphic circuit 200 simultaneously executes several computing operations in parallel. The analog neuromorphic circuit 200 includes a plurality of resistive memories 210(*a-n*) where n is an integer equal to or greater than four, a plurality of horizontal wires 220(*a-n*) where n is an integer equal to or greater than two, a pair of vertical wires 230(*a-b*), a plurality of input voltages 240(*a-n*) where n is an integer equal to or greater than two, a pair of bias voltage connections 250(*a-b*), a first and second input of a comparator 260(*a-b*), a comparator 270, an output of the comparator 280, a pair of weights 290(*a-b*), and a combined weight 295. The analog neuromorphic circuit 200 shares many similar features with the analog neuromorphic processing device 100; therefore, only the differences between the analog neuromorphic circuit 200 and the analog neuromorphic processing device 100 are to be discussed in further detail.

The analog neuromorphic circuit 200 may be representative of a single neuron of a neural network. The analog neuromorphic circuit 200 has the capability to be scaled to interact with several other analog neuromorphic circuits so that multiple neurons may be implemented in the neural network as well as creating multiple layers of neurons in the neural network. Such a scaling capability to include not only multiple neurons but also multiple layers of neurons significantly magnifies the computational efficiency of the neural network, as will be discussed in further detail below.

The resistive memories 210(*a-n*) may be laid out in a crossbar configuration that includes a high density wire grid. The crossbar configuration enables the resistive memories 210(a-n) to be tightly packed together in the wire grid as will be discussed in further detail below. The tightly packed resistive memories 210(a-n) provides a high density of resistive memories 210(a-n) in a small surface area of a chip such that numerous analog neuromorphic circuits may be positioned in a neural network on a chip while occupying little space. The crossbar configuration also enables the resistive memories 210(a-n) to be positioned so that the analog neuromorphic circuit 200 may execute multiple addition and multiplication operations in parallel in the analog domain. The numerous neuromorphic circuits may then be positioned in the neural network so that the multiple addition and multiplication operations that are executed in parallel may be scaled significantly, thus exponentially increasing the computational efficiency. The resistive memories 210(a-n) are passive devices so that the multiple addition and multiplication operations executed in parallel are done in the analog domain, which also exponentially decreases the required power.

As a result, the analog neuromorphic circuits that are configured into a neural network have the capability of executing applications requiring significant computation power, such as image recognition. The analog neuromorphic circuits also have learning capability as will be discussed in further detail below so that the analog neuromorphic circuits may successfully execute learning algorithms.

Referring to FIG. 3, in which like reference numerals are used to refer to like parts, neural network configuration 300 that the analog neuromorphic circuit 200 may be implemented and scaled into is shown. The neural network configuration 300 shares many similar features with the analog neuromorphic processing device 100 and the analog neuromorphic circuit 200; therefore, only the differences between the neural network configuration 200 and the analog neuromorphic processing device 100 and the analog neuromorphic circuit 200 are to be discussed in further detail.

The analog neuromorphic circuit 200 may be implemented into the neural network configuration 300. The analog neuromorphic circuit 200 may constitute a single neuron, such as neuron 310a in the neural network configuration 300. As shown in FIG. 3, the input voltage 240a and represented by "A" is applied to the horizontal wire 220a, the input voltage 240b and represented by "B" is applied to the horizontal wire 220b, and the input voltage 240n and represented by "C" is applied to the horizontal wire 220c. The combined weight 295 as shown in FIG. 2 as representative of the combined weight for the input voltage 240a is shown as in FIG. 3. Similar combined weights for the input voltage 240b and the input voltage 240n may also be represented in FIG. 3 in a similar fashion. The wire grid, the resistive memories 210(a-n), and the comparator 270 are represented by the neuron 310a. The output 280 of the analog neuromorphic circuit 200 is coupled to additional neurons 320a and 320b.

The analog neuromorphic circuit 200 may then be scaled so that similar circuits may be configured with the analog neuromorphic circuit 200 to constitute additional neurons, such as neurons 310(b-n) where n is an integer greater than or equal to two. Each of the other neurons 310(b-n) includes similar circuit configurations as the analog neuromorphic circuit 200. However, the resistances of the resistive memories associated with each of the other neurons 310(b-n) may differ from the analog neuromorphic circuit 200 so that outputs that differ from the output 280 of the analog neuromorphic circuit 200 may be generated.

Rather than limiting the input voltages 240(a-n) to be applied to a single neuron 310, the input voltages 240(a-n) may also be applied to multiple other neurons 310(b-n) so that each of the additional neurons 310(b-n) also generate outputs that differ from the output 280 generated by the analog neuromorphic circuit 200. The generation of multiple different outputs from the different neurons 310(a-n) exponentially increases the computational efficiency of the neural network configuration 300. As noted above, the analog neuromorphic circuit 200 represented by the neuron 310a operates as a single logic function with the type of logic function being adjustable. The addition of neurons 310(b-n) provides additional logic functions that also have the capability of their logic functions being adjustable so that the computational efficiency of the neural network configuration 300 is significant.

In addition to having several different neurons 310(a-n), the analog neuromorphic circuit 200 may also be scaled to include additional layers of neurons, such as neurons 320 (a-b). The scaling of additional layers of neurons also exponentially increases the computational efficiency of the neural network configuration 300 to the extent that the neural network configuration 300 can execute learning algorithms. For example, a neural network configuration with a significant number of input voltages, such as several hundred, that are applied to a significant number of neurons, such as several hundred, that have outputs that are then applied to a significant number of layers of neurons, such as hundreds, may be able to execute learning algorithms. The repetitive execution of the learning algorithms by the extensive neural network configuration may result in the neural network configuration eventually attaining automatic image recognition capabilities.

For example, the neural network configuration may eventually output a high voltage value of "$F_1$" representative of the binary signal "1" and output a low voltage value of "$F_2$" representative of the binary signal "0" when the neural network configuration recognizes an image of a dog. The neural network configuration may then output a low voltage value of "$F_1$" representative of the binary signal "0" and output a high voltage value of "$F_2$" representative of the binary signal "1" when the neural network configuration recognizes an image that is not a dog.

However, the neural network configuration 300 does not automatically output a binary signal "1" for "$F_1$" and a binary signal "0" for "$F_2$" when the neural network configuration 300 recognizes an image of a dog. The neural network configuration 300 may have to execute learning algorithms in millions of iterations until the resistance values of each memristor included in the neural network configuration 300 is at a value so that the neural network configuration 300 outputs a binary signal "1" for "$F_1$" and a binary signal "0" for "$F_2$" when the neural network configuration 300 recognizes the image of a dog.

Figure 4:
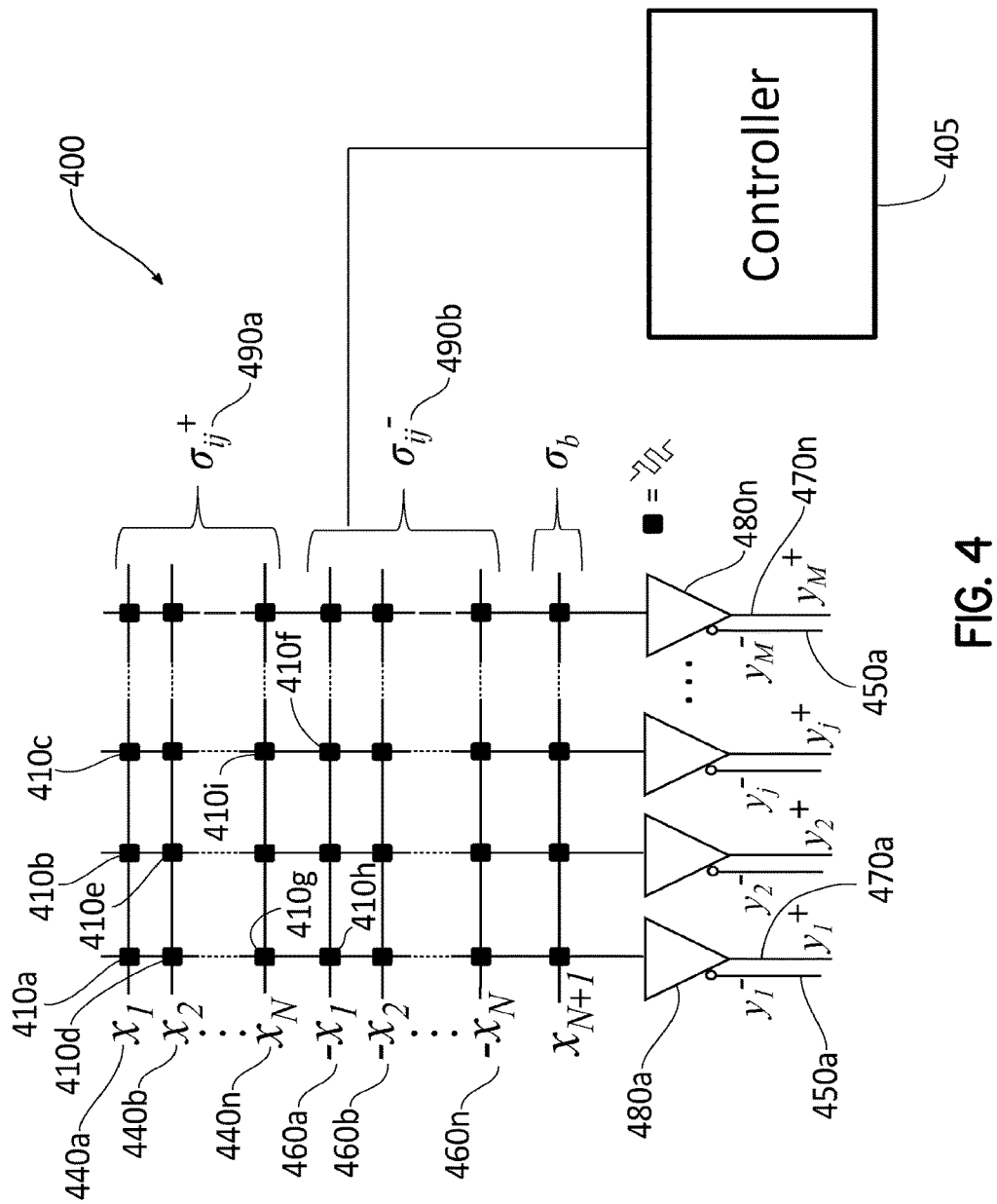
FIG. 4 is a schematic illustration of an exemplary an analog neuromorphic circuit that may be implemented to execute dot-product operations in a similar manner as a conventional computing device in accordance with an embodiment of the disclosure.

Referring to FIG. 4, in which like reference numerals are used to refer to like parts, an analog neuromorphic circuit 400 is shown that may be implemented to execute dot-product operations in a similar manner as a conventional computing device. The analog neuromorphic circuit 400 includes a plurality of resistive memories 410(a-n), a plurality of input voltages 440(a-n), a plurality of complemented input voltages 460(a-n), a plurality of conductance 490a, a plurality of complemented conductance 490b, a plurality of amplifiers 480(a-n), a plurality of dot-product operation values 470(a-n), and a plurality of complemented dot-product operation values 450(a-n). The analog neuromorphic circuit 400 shares many similar features with the analog neuromorphic processing device 100, the analog neuromorphic circuit 200, and the neural network configuration 300; therefore, only the differences between the analog neuromorphic circuit 400 and the analog neuromorphic processing device 100, the analog neuromorphic circuit 200, and the neural network configuration 300 are to be discussed in further detail.

The analog neuromorphic circuit 400 may be implemented so that dot-product operations may be executed in a similar manner as a conventional computing system would execute dot-product operations but utilizing significantly less power than a conventional computing system and requiring significantly less space than a conventional computing system. For example, conventional computing systems execute dot-product operations in applications such as neural applications, image recognition, image processing, digital signal processing, video games, graphics and so on. In executing the dot-product operations, the conventional computing systems execute a vector/matrix multiplication operation where the conventional computing system takes values in a vector format and executes a multiplication operation with values in a matrix format.

However, conventional computing systems are able to execute dot-product operations when the values included in the vector format as well as the values included in the matrix format are non-binary numbers, such as floating point numbers, such that the outputs of the executed dot-product operations are also non-binary numbers. Conventional computing systems are not limited to simple values such as positive integer values. Rather, conventional computing systems are able to execute dot-product operations with any floating point number whether those floating point numbers be positive or negative. For example, a simple electronic calculator is capable of multiplying a negative floating point number of "−2.35965" with a positive floating point number of "7.525" to generate a negative floating point number of "−17.5636625".

As noted above, the analog neuromorphic circuit 400 may execute dot product operations with regards to non-binary numbers in a similar manner as conventional computing devices without consuming significant amounts of power and/or incorporating significant amounts of space as conventional computing devices. In doing so, each value included in the vector that is requested to take part in the dot-product operation with the matrix is converted to a voltage and is applied as an input voltage 440(*a-n*) to each horizontal wire 220(*a-n*) as discussed in detail above. For example, the vector in Equation 1, $$\begin{matrix} 2.35 \\ -5.86 \\ 2.4 \end{matrix} \qquad (1)$$

may be applied to the analog neuromorphic circuit 400 where "2.35" is applied as a voltage of 2.35V as input voltage 440*a* to horizontal wire 220*a*, "−5.86" is applied as a voltage of −5.86V as input voltage 440*b* to horizontal wire 220*b* and "2.4" is applied as a voltage of 2.4V as input voltage 440*n* to horizontal wire 220*c*.

Each value included in the matrix that is requested to take part in the dot-product operation with the vector may then be mapped to a resistance value associated with a resistive memory 410(*a-n*). For example, the matrix in Equation 2, $$W = \begin{matrix} 5.76 & -8.92 & 26.77 \\ -100.25 & 2.59 & -1.23 \\ 56.89 & -9.25 & 17.88 \end{matrix} \qquad (2)$$

may be mapped to the analog neuromorphic circuit 400 where "5.76" is mapped to the resistance value associated with resistive memory 410*a*, "−8.92" is mapped to the resistance value associated with resistive memory 410*b*, "26.77" is mapped to the resistance value associated with resistive memory 410*c*, "−100.25" is mapped to the resistance value associated with resistive memory 410*d*, "2.59" is mapped to the resistance value associated with resistive memory 410*e*, "−1.23" is mapped to the resistance value associated with resistive memory 410*f*, "56.89" is mapped to the resistance value associated with resistive memory 410*g*, "−9.25" is mapped to the resistance value associated with resistive memory 410*h*, and "17.88" is mapped to the resistance value associated with resistive memory 410*i*.

As noted above, each resistance value associated with each resistive memory 440(*a-n*) may be adjusted within a range of resistance values. However, the range of resistance values that each resistive memory 440(*a-n*) may be adjusted to is limited to positive values within a finite range of resistance values. For example, the resistance value of each resistive memory 440(*a-n*) may be adjusted to positive values within a range of 10,000 to 100,000. The limitation of resistance values for each resistive memory 440(*a-n*) to positive values within a finite range of resistance values prevents a matrix that includes values such as negative floating point numbers from being directly mapped onto the resistive memories 440(*a-n*). For example, the matrix value of "−8.92" in the matrix shown in Equation 2 may not be directly mapped to resistive memory 410*b* due to the possible resistance values of resistive memory 410*b* being unable to accommodate a negative value as well the floating point number of "−8.92" being outside the range of the potential resistance values of the resistive memory 410*b*.

However, the controller 405 may adjust the resistance values of each of the resistive memories 410(*a-n*) such that the resistance values have the flexibility to accommodate non-binary values, such as positive and/or negative floating point numbers, that are represented by the matrix values included in the matrix that is engaged in a dot-product operation with the specified vector. For example, the controller 405 may adjust the resistance values of the resistive memories 410(*a-n*) so that the matrix values included in the example matrix of Equation 2 may be mapped onto the resistive memories 410(*a-n*). In doing so, the analog neuromorphic circuit 400 may execute dot-product operations that involve positive and/or negative floating point numbers included in the vector and/or matrix and is also able to accurately generate the dot-product operation values resulting from the dot-product operation of the vector and matrix such that the generated dot-product operation values also represent positive and/or negative floating point numbers. Thus, the analog neuromorphic circuit 400 may execute dot product operations in a similar manner as the conventional computing device in accommodating positive and/or negative floating point numbers but may do so with significantly less power and occupying significantly less space than the conventional computing device.

The controller 405 may adjust the resistance values of each of the resistive memories 410(*a-n*) to accommodate the non-binary values included in the matrix by pairing each resistive memory 410(*a-n*) with another resistive memory so that each pair of resistive memories includes a pair of resistance values. The controller 405 may then convert each pair of resistance values from a pair of positive resistance values selected from the finite range of resistance values to a single non-binary value that is representative of a matrix value included in the example matrix.

As noted above, each resistance value associated with each resistive memory 410(a-n) may be adjusted to a positive value within a finite range of positive values. The controller 405 may then pair each resistive memory and select a resistance value within the finite range of resistance values for each of the pair of resistive memories. The controller 405 may then generate a relationship between the pair of resistive memories such that a relationship between the resistance value of the first resistive memory and the resistance value of the second resistive memory represents a non-binary value, such as a positive or negative floating point number. For example, the controller 405 may pair the resistive memory 410a and the resistive memory 410d and select a resistance value of 1000 for resistive memory 410a and a resistance value of 900 for 410d. The controller 405 may then generate a relationship between the resistive memory 410a and resistive memory 410d such that the relationship between the resistance value of 1000 and the resistance value of 900 is substantially equivalent to the matrix value of "−8.92" in the example matrix of Equation 2.

In an embodiment, the controller 405 may map each positive matrix value included in the matrix into a first relationship with the corresponding pair of resistive memories so that the first relationship converts the corresponding pair of positive resistance values selected from the finite range of resistance values to a positive single non-binary value that represents the positive matrix value. In such an embodiment, the matrix W may be transformed into a first matrix $W^+$. Matrix $W^+$ contains positive non-zero elements in each position where $W_{ij}$ is greater than 0 and zeroes are in all other positions. Therefore, $W_{ij}^+=W_{ij}$ when $W_{ij}$ is greater than 0 and $W_{ij}^+=0$ when $W_{ij}$ is less than or equal to 0. For example, the positive non-zero values in matrix W is incorporated into the matrix $W^+$ in Equation 3, $$W^+ = \begin{matrix} 5.76 & 0 & 26.277 \\ 0 & 2.59 & 0 \\ 56.89 & 0 & 17.88 \end{matrix} \quad (3)$$

where each of the positive matrix values remain in the matrix and each of the negative matrix values are replaced with zeroes.

The controller 405 may then identify a minimum resistance value and a maximum resistance value that corresponds to a pair of resistive memories that is associated with each positive matrix value incorporated into the first matrix and may select resistance values for each of the resistive memories that are within the minimum resistance value and the maximum resistance value. The controller 405 may then convert the selected resistance values for each pair of resistive memories into a single non-binary value that is representative of the corresponding positive matrix value based on the first relationship.

For example, the controller 405 may pair a resistive memory from the resistive memories 410(a-n) that have a conductance applied to them from the conductivity signal 490a, with a resistive memory from the resistive memories 410(a-n) that have a negative conductance applied to them from the conductivity, such as conductance signal 490b. In such an example, resistive memory 410c that has a conductance applied to it from the conductance signal 490a may be paired with resistive memory 410f that has a conductance applied to it from the conductance signal 490b and thereby associate the resistance values of resistive memories 410c and 410f with the positive matrix value of 5.76 in Equation 3. The controller 405 may then identify a minimum resistance value and a maximum resistance value for the resistance values of resistive memories 410c and 410f and select resistance values for the resistive memories 410c and 410f that are within the minimum and maximum resistance value range for the resistive memories 410c and 410f. The controller 405 may then convert the selected resistance values for resistive memories 410c and 410f into a single non-binary value that represents the corresponding positive matrix value of 5.76 based on the first relationship.

The controller 405 may also map each negative matrix value included in the matrix into a second relationship with the corresponding pair of resistive memories so that the second relationship converts the corresponding pair of positive resistance values selected from the finite range of resistance values to a negative single non-binary value that represents the negative matrix value. In such an embodiment, the matrix W may be transformed into a second matrix $W^-$. Matrix $W^-$ contains positive non-zero elements in each position where $W_{ij}$ is less than 0 and zeroes are in all other positions. Therefore, $W_{ij}^-=$ the absolute value of $W_{ij}$ when $W_{ij}$ is less than 0 and $W_{ij}^-$ is equal to 0 and $W_{ij}$ is greater than or equal to 0. For example, the positive non-zero values in matrix W is incorporated into the matrix $W^-$ in Equation 4, $$W^- = \begin{matrix} 0 & 8.92 & 0 \\ 100.25 & 0 & 1.23 \\ 0 & 9.25 & 0 \end{matrix} \quad (4)$$

where each of the negative matrix values remain in the matrix as positive values and each of the positive matrix values are replaced with zeroes.

The controller 405 may then identify a minimum resistance value and a maximum resistance value that corresponds to a pair of resistive memories that is associated with each negative matrix value incorporated into the second matrix and select resistance values for each of the resistive memories that are within the minimum resistance value and the maximum resistance value. The controller 405 may then convert the selected resistance values for each pair of resistive memories into a single non-binary value that is representative of the corresponding negative matrix value based on the second relationship.

For example, the controller 405 may pair a resistive memory from the resistive memories 410(a-n) that have a conductance applied to them from the conductance signal 490a, with a resistive memory from the resistive memories 410(a-n) that have a conductance applied to them from the conductance signal 490b. In such an example, resistive memory 410g that has a conductance applied from the conductance signal 490a may be paired with resistive memory 410h that has a conductance applied to it from the conductance signal 490b and thereby associate the resistance values of resistive memories 410g and 410h with the negative matrix value of −8.92 in Equation 4. The controller 405 may then identify a minimum resistance value and a maximum resistance value that the resistance values of resistive memories 410g and 410h and select resistance values for the resistive memories 410g and 410h that are within the minimum and maximum resistance value range for the resistive memories 410g and 410h. The controller 405 may then convert the selected resistance values for resistive memories 410g and 410h into a single non-binary value that represents the corresponding negative matrix value of −8.92 based on the second relationship.

In an embodiment, the controller 405 may map each positive input voltage and each positive matrix value into a co-linear first relationship with the corresponding pair of resistive memories so that the co-linear first relationship converts a corresponding pair of conductance values selected from a finite range of conductance values to the positive single non-binary value that represents the positive weighted matrix value.

As noted above, each of the vector values included in the vector are applied as input voltages 440(a-n). For example, with regards to the vector in Equation 1, "2.35" is applied as a voltage of 2.35V as input voltage 440a to horizontal wire 220a, "−5.86" is applied as a voltage of −5.86V as input voltage 440b to horizontal wire 220b and "2.4" is applied as a voltage of 2.4V as input voltage 440n to horizontal wire 220c. Each complement of the vector value may also be applied to the analog neuromorphic circuit 400 as complemented input voltages 460(a-n). For example, with regards to the vector in Equation 1, the complement "−2.35" is applied as a voltage of −2.35V as complemented input voltage 460a to horizontal wire 220d, the complement "5.86" is applied as a voltage of 5.86 as complemented input voltage 460b to horizontal wire 220e, and the complement "−2.4" is applied as a voltage of −2.4V as complemented input voltage 460n to horizontal wire 220f.

With both the input voltages 440(a-n) representing the vector values as well as the complemented input voltages 460(a-n) representing the complemented vector values applied to the analog neuromorphic circuit 400, the controller 405 may generate a co-linear first relationship between the corresponding pair of resistive memories to each positive matrix value. In order to generate the co-linear relationship, the controller 405 may identify the finite range of conductance values for each pair of resistive memories. The conductance values of the resistive memories 410(a-n) is the inverse of the resistance values of the resistive memories 410(a-n). The controller may then determine a conductance value for each of the resistive memories included in the pair corresponding to the positive matrix value.

In an embodiment, each value in the matrix may be reproduced by subtracting the second matrix $W^-$ the first matrix $W^+$ such that in Equation 5, $$W = W^+ - W^-. \tag{5}$$

The conductance values of the resistive memories 410(a-n) may then be implemented to represent the values provided in the matrix W. Thus, the value included in the matrices $W^+$ and $W^-$ may be converted to a bounded number within the conductance range for each corresponding pair of resistive memories in the analog neuromorphic circuit 400. The controller 405 may then linearly scale the selected conductance value for each of the resistive memories included in the pair so those selected values are between the minimum conductance level $\sigma_{min}$ and the maximum conductance level $\sigma_{max}$ where the minimum conductance level $\sigma_{min}$ and the maximum conductance level $\sigma_{max}$ represent the linearly scaled minimum and maximum conductance values, respectively, for the pair of resistive memories.

The controller 405 may then determine a conductance value for each of the resistive memories included in the pair of resistive memories corresponding to the positive matrix value based on the co-linear relationship provided in Equation 6, $$\sigma^+ = \frac{(\sigma \max - \sigma \min)}{\max(\text{absolute value of } W)} W^+ + \sigma_{min} \tag{6}$$

and Equation 7, $$\sigma^- = \frac{(\sigma \max - \sigma \min)}{\max(\text{absolute value of } W)} W^- + \sigma_{min}. \tag{7}$$

The adding of the minimum conductance level $\sigma_{min}$ to each of the values ensures that each of the zeros in the first matrix $W^+$ and the second matrix $W^-$ may be at the minimum conductance level for the pair of resistive memories. The original matrix w may then be recovered from Equation 8, $$W = \frac{\max(\text{absolute value of } W)}{(\sigma \max - \sigma \min)} (\sigma^+ - \sigma^-). \tag{8}$$

For example, the controller 405 may incorporate equations 6 and 7 so that a positive matrix value, such as positive matrix value 26.77 in the example matrix of Equation 2, may generate a conductance signal that is within the minimum conductance level $\sigma_{min}$ and the maximum conductance level $\sigma_{max}$ of the pair of resistive memories corresponding to the positive matrix value of 26.77. Since 26.77 is a positive matrix value, the controller 405 may determine the conductance values of $\sigma^+$ and $\sigma^-$ for the pair of resistance values by incorporating equations 6 and 7 in the following manner:

$$\sigma^+ = \frac{(\sigma \max - \sigma \min)}{\max(\text{absolute value of } W)} (26.77) + \sigma_{min}, \text{ and} \tag{9}$$

$$\sigma^- = \frac{(\sigma \max - \sigma \min)}{\max(\text{absolute value of } W)} (0) + \sigma_{min} \tag{10}$$

where a conductance value of $\sigma^+$ and a conductance value of $\sigma^-$ may be generated by the controller 405 for the pair of resistive memories representing the positive matrix value 26.77. The controller 405 may then convert the conductance values of $\sigma^+$ and $\sigma^-$ into a positive single non-binary value that represents the positive matrix value of 26.77.

In a similar manner, the controller 405 may map each negative matrix value into a co-linear second relationship with the corresponding pair of resistive memories so that the co-linear second relationship converts a corresponding pair of conductance values selected from the finite range of conductance values to the negative single non-binary value that represents the negative weighted matrix value.

For example, the controller 405 may incorporate equations 6 and 7 so that a negative matrix value, such as negative matrix value −100.25 in the example matrix of Equation 2, may generate a conductance signal that is within the minimum conductance level $\sigma_{min}$ and the maximum conductance level $\sigma_{max}$ of the pair of resistive memories corresponding to the negative matrix value of −100.25. Since −100.25 is a negative matrix value, the controller 405 may determine the conductance values of $\sigma^+$ and $\sigma^-$ for the pair of resistance values by incorporating equations 6 and 7 in the following manner:

$$\sigma^+ = \frac{(\sigma\max - \sigma\min)}{\max(\text{absolute value of } W)}(0) + \sigma_{min}, \text{ and} \quad (11)$$

$$\sigma^- = \frac{(\sigma\max - \sigma\min)}{\max(\text{absolute value of } W)}(-100.25) + \sigma_{min} \quad (12)$$

where a conductance value of $\sigma^+$ and a conductance value of $\sigma^-$ may be generated by the controller 405 for the pair of resistive memories representing the positive matrix value −100.25. The controller 405 may then convert the conductance values of $\sigma^+$ and $\sigma^-$ into a negative single non-binary value that represents the negative matrix value of −100.25.

After the controller 405 has determined the conductance values $\sigma^+$ and $\sigma^-$ for each pair of resistive memories included in the analog neuromorphic circuit 400, the controller may adjust the resistance values of each pair of resistive memories the conductance values $\sigma^+$ and $\sigma^-$ with the conductance signal 490a and the conductance signal 490b. The adjustment of the resistance values of each pair of resistive memories to the conductance values $\sigma^+$ and $\sigma^-$ configures the analog neuromorphic circuit 400 such that the resistive memories 410(a-n) represent the non-binary values included in the matrix, such as the positive or negative floating point numbers in the example matrix in Equation 2.

The dot-product operation with a vector, such as the example vector in Equation 1, and a matrix, such as the example matrix in Equation 2, may then be executed incorporating the analog neuromorphic circuit 400. As noted above, each of the values in the vector may be applied as input voltages 440(a-n) to each corresponding horizontal wire 220(a-n). Currents may then be generated as each input voltage 440(a-n) is applied to each resistance value associated with each resistive memory 440(a-n) as adjusted by the controller 405. The currents may then propagate through the analog neuromorphic circuit 400 in a fashion where the dot product operation is executed with the dot-product operation values 470(a-n) generated as output values of the dot product operation. This process is discussed in detail in U.S. Nonprovisional application Ser. No. 15/082,537 and is incorporated by reference in its entirety.

With the conversion of the resistance values for the resistive memories 410(a-n) to represent to represent the non-binary values included in a matrix, the analog neuromorphic circuit 400 is able to execute dot product operations in a similar manner as conventional computing systems but with consuming significantly less power and occupying significantly less space than conventional computing systems. The analog neuromorphic circuit 400 is capable of executing dot product operations in numerous applications such as but not limited to neural applications, image recognition, image processing, digital signal processing, video games, graphics and so on.

For example, the analog neuromorphic circuit 400 may be incorporated into image processing applications where the vector represents an image and the matrix includes a set of weighted values that are to be applied to the image to improve the quality of the image that is to be displayed. Through numerous iterations, the resistance values of the resistive memories 410(a-n) may be adjusted until the resistance values accurately represent the weighted values included in the matrix and the dot-product operation values 470(a-n) generated by the analog neuromorphic circuit 400 depict a high-quality display of the image.

In another example, the analog neuromorphic circuit 400 may be incorporated into digital signal processing applications where a filter may be applied to an image to improve and/or change the quality of the image. In doing so, the analog neuromorphic circuit 400 may execute a convolution operation where the filter as defined by a kernel matrix is directly applied to a matrix depicting the image and generate an image with improved and/or changed quality without having to execute the neural operations where the resistance values of the resistive memories 410(a-n) are adjusted through numerous iterations.

In such an example, the image that the filter is to be applied to is defined in example image matrix $x_{ex}$ in Equation 13, $$x_{ex} = \begin{bmatrix} 0 & 0.5 & 0.3 \\ 0.5 & 0.8 & 0.5 \\ 0 & 0.5 & 0 \end{bmatrix} \rightarrow \begin{pmatrix} 0 \\ 0.5 \\ 0.3 \\ 0.5 \\ 0.8 \\ 0.5 \\ 0 \\ 0.5 \\ 0 \end{pmatrix} \begin{pmatrix} \overset{x_{ex}}{0} \\ 0.5 \\ 0.3 \\ 0.5 \\ 0.8 \\ 0.5 \\ 0 \\ 0.5 \\ 0 \end{pmatrix} \begin{pmatrix} \overset{-x_{ex}}{0} \\ -0.5 \\ -0.3 \\ -0.5 \\ -0.8 \\ -0.5 \\ 0 \\ -0.5 \\ 0 \end{pmatrix}. \quad (13)$$

The image is a two-dimensional image as depicted by the image matrix $x_{ex}$. However, as noted in detail above, the analog neuromorphic circuit 400 requires that the input values be represented in a vector format so that the vector values may be applied to the analog neuromorphic circuit 400 as input voltages 440(a-n) and complemented input voltages 460(a-n). Thus, the controller 405 may convert the image matrix $x_{ex}$ into a vector such that the vector values may then be applied to the analog neuromorphic circuit 400 as the input voltages 440(a-n) and the complemented input voltages 460(a-n). With regards to Equation 14, the controller 405 may convert the image matrix $x_{ex}$ into the vector values included in the vector $x_{ex}$ that are applied as the input voltages 440(a-n) and the vector values included in the vector $-x_{ex}$ that are applied as the complemented input voltages 460(a-n).

The filter that is to be directly applied to the image may be defined in the example kernel matrix $k_{ex}$ in Equation 14, $$k_{ex} = \begin{bmatrix} 0.1 & -0.2 & 0.3 \\ -0.4 & 0.5 & -0.6 \\ 0.7 & -0.8 & 0.9 \end{bmatrix} \rightarrow \begin{pmatrix} 0.9 \\ -0.6 \\ 0.3 \\ -0.8 \\ 0.5 \\ -0.2 \\ 0.7 \\ -0.4 \\ 0.1 \end{pmatrix} \begin{pmatrix} \overset{k_{ex}^+}{0.9} \\ 0 \\ 0.3 \\ 0 \\ 0.5 \\ 0 \\ 0.7 \\ 0 \\ 0.1 \end{pmatrix} \begin{pmatrix} \overset{k_{ex}^-}{0} \\ 0.6 \\ 0 \\ 0.8 \\ 0 \\ 0.2 \\ 0 \\ 0.4 \\ 0 \end{pmatrix}. \quad (14)$$

The controller 405 may then convert the kernel matrix $k_{ex}$ into $k_{ex}^+$ and $k_{ex}^-$ which are similar to $W^+$ and $W^-$ discussed above. The controller 405 may then determine the minimum conductance level $\sigma_{min}$ and the maximum conductance level $\sigma_{max}$ for each pair of resistive memories so that the values included in $k_{ex}^+$ and $k_{ex}^-$ may be accurately represented by the resistive memories 410(a-n) in the analog neuromorphic circuit 400 as discussed in detail above. The convolution operation of passing through the image $x_{ex}$ through the filter of the kernel matrix $k_{ex}$ may then be executed with the analog neuromorphic circuit 400 rather than a convention computing system.

Figure 5:
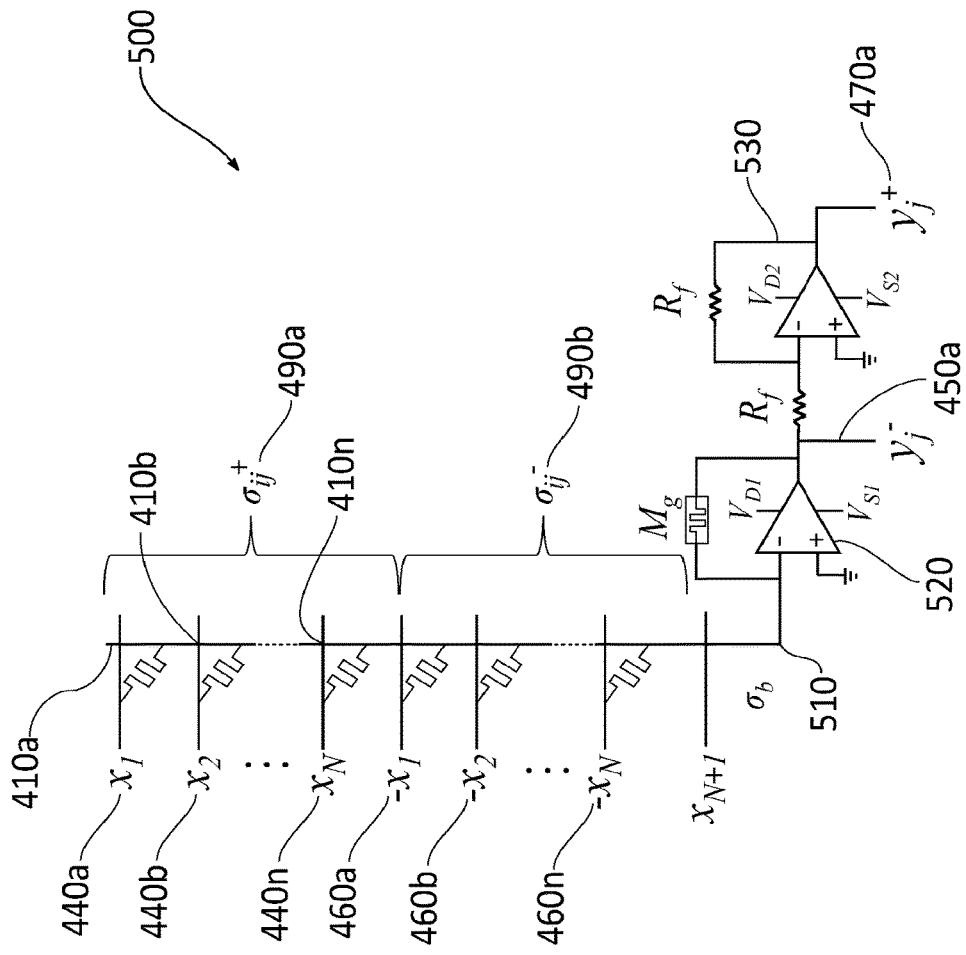
FIG. 5 is a schematic illustration of an exemplary output configuration as depicted with a column of an analog neuromorphic circuit that may be implemented to convert the output voltage of the column generated from the execution of dot-product operations to a dot-product operation value in accordance with an embodiment of the disclosure.

Referring to FIG. 5, in which like reference numerals are used to refer to like parts, an output configuration 500 as depicted with a column of an analog neuromorphic circuit 400 that may be implemented to convert the output voltage of the column generated from the execution of dot-product operations to a dot-product operation value is shown. The output configuration 500 includes the plurality of resistive memories 410(a-n), the plurality of input voltages 440(a-n), the plurality of complemented input voltages 460(a-n), the conductance 490a, the conductance 490b, an output voltage value 510, a first op-amp configuration 520 and a second op-amp configuration 530. The output configuration 500 shares many similar features with the analog neuromorphic processing device 100, the analog neuromorphic circuit 200, the neural network configuration 300; and the analog neuromorphic circuit 400 therefore, only the differences between the output configuration 500, and the analog neuromorphic circuit 400, the analog neuromorphic processing device 100, the analog neuromorphic circuit 200, and the neural network configuration 300 are to be discussed in further detail.

After the dot product operation has been executed, each column of the analog neuromorphic circuit 400 generates an output voltage signal 510. The output voltage signal 510 is generated from each input voltage 440(a-n) being applied to each corresponding horizontal wire 220(a-n) and then generating a current from each of the resistive values for each resistive memory 410(a-n) that is then propagated through the analog neuromorphic circuit 400 as discussed in detail in U.S. Nonprovisional application Ser. No. 15/082,537. The output voltage signal 510 that is generated as an output of each column in the analog neuromorphic circuit 400 represents the dot-product operation values generated from the dot product operation of the vector and the matrix by the analog neuromorphic circuit 400. However, the output voltage signal 510 is a voltage and is yet to be converted to a non-binary value, such as a positive or negative floating point number, that is substantially equivalent to the dot-product operation value.

Positioning a comparator configuration at the output of each column of the analog neuromorphic circuit 400 compares the output voltage signal of each column to a desired output voltage signal and then generates a binary signal in a "0" or a "1" based on the comparison. The generated binary signal "0" or "1" may then be incorporated into the application that the analog neuromorphic circuit 400 is being implemented to execute such as correctly identifying whether an image depicts a "3". The conversion of the output voltage signal to a binary signal of a "0" or a "1" with a comparator configuration requires that each output voltage signal be classified as binary value of a "0" or a "1". With regards to image classification applications, the conversion of each output voltage signal to a binary value of a "0" or "1" may accurately identify simpler images such as an image of a "3" but may become less accurate with more complicated images such as correctly identifying an image as a dog.

However, as noted above, the analog neuromorphic circuit 400 generates significantly more complicated output voltage signals with the execution of the dot product operations that accommodate non-binary values, such as positive or negative floating point numbers. As a result, the output voltage signal 510 is a voltage value that represents the dot-product operation value of the analog neuromorphic circuit 400 where the dot-product operation value is a non-binary value, such as a positive or negative floating point number.

Figure 6:
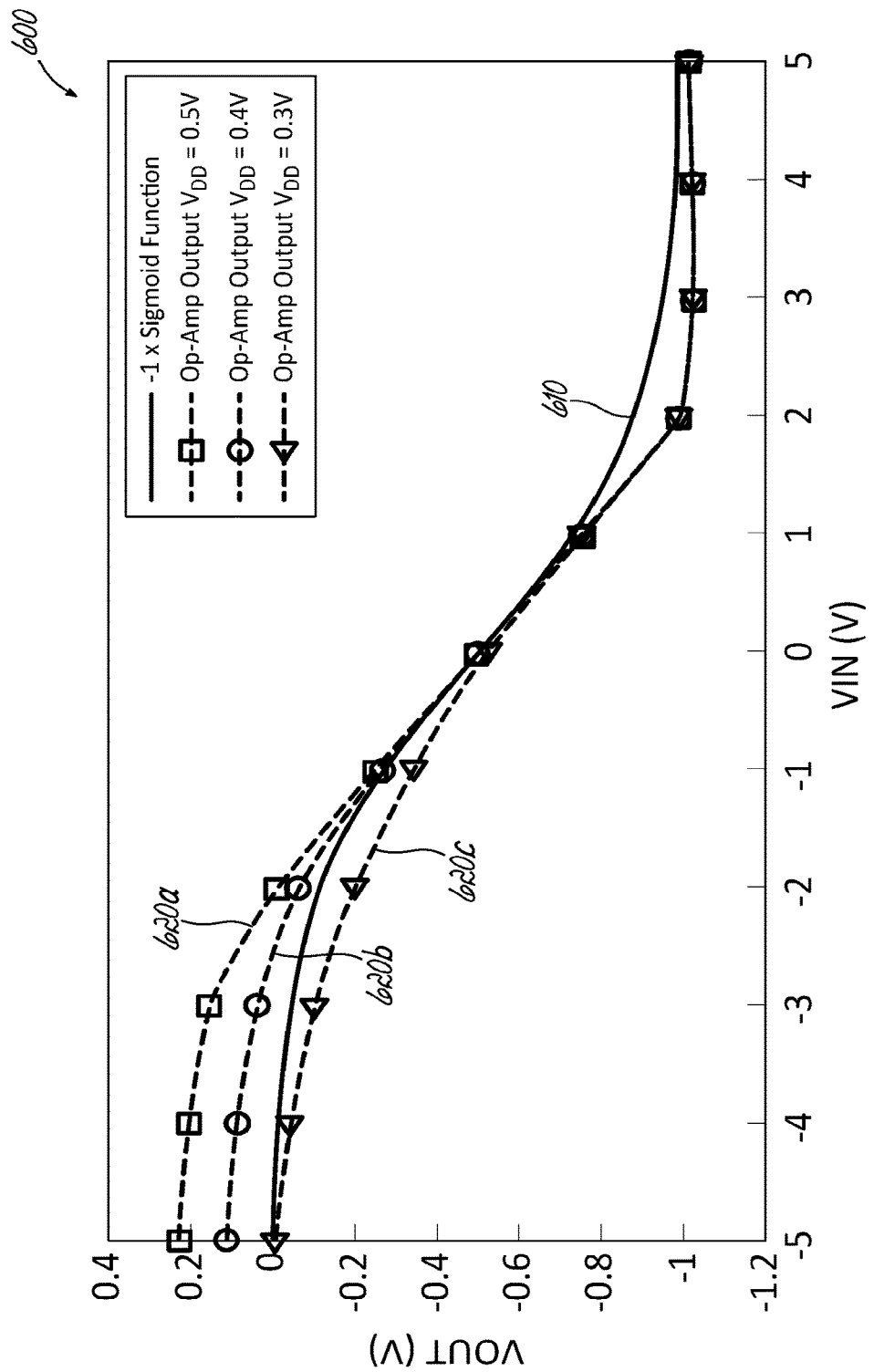
FIG. 6 is a schematic illustration of an op-amp configuration that may generate a pseudo sigmoid function in accordance with an embodiment of the disclosure.

Rather than classifying the output voltage signal 510 as a binary value of a "0" or a "1", the output configuration 500 may be incorporated into the analog neuromorphic circuit 400 to simulate a non-linear smooth function configuration 600 in FIG. 6, such as a sigmoid function, as compared to a linear function that represents a binary output of a "0" or "1". The simulation of the non-linear smooth function 610, such as the sigmoid function, enables the output configuration 500 to convert the output voltage signal 510 to the non-binary values represented by the dot-product operation value 470a and the complemented dot-product operation value 450a. In doing so, the output configuration 500 may enable the analog neuromorphic circuit 400 to execute more accurately complicated applications such as identifying an image of a dog. As shown in FIG. 6, the non-linear smooth function 610 may be a continuous smooth function between the values of 0 and 1, which may provide the vehicle in which the output voltage signal 510 may be converted to the non-binary values represented by the dot-product operation value 470a and the complemented dot-product operation value 450a. The output configuration 500 may convert the output voltage signal to model the sigmoid function, the inverse tangent function, and/or any other type of non-linear smooth function that is apparent to those skilled in the art.

The output configuration 500 includes the first op-amp configuration 520 and the second op-amp configuration 530 that may be positioned at the output of each column of the analog neuromorphic circuit 400 to both scale the output voltage signal 510 to a value on the non-linear smooth function 610 between "0" and "1" and does so by incorporating a neuron function such as an activation function and/or a thresholding function. The first op-amp configuration 520 may generate a pseudo sigmoid function, such as pseudo sigmoid functions 620(a-c) as shown in FIG. 6. The first op-amp configuration 520 may be configured such that the op-amp linear configuration 520 incorporates a linear amplifier transfer function bounded by upper and lower voltage rails that are similar to the desired bounds of the non-linear smooth function 600. For example, the first op-amp configuration 520 may incorporate a linear amplifier transfer function that is bounded by an upper voltage of 1.0V and a lower voltage of 0.0V.

The first op-amp configuration voltage 540a may then be adjusted such that the first op-amp configuration 520 generates the pseudo sigmoid functions 620(a-c). For example, the first op-amp configuration voltage 540a may be adjusted to 0.3V such that the first op-amp configuration 520 generates the pseudo sigmoid function 620c. The pseudo sigmoid functions 620(a-c) may not be pure non-linear smooth functions but rather linear amplifier transfer functions that are adequately similar to the non-linear smooth function 610. The first op-amp configuration voltage 540a may be optimally adjusted such that the first op-amp configuration 520 generates the pseudo sigmoid functions 620(a-c) such that the pseudo sigmoid functions 620(a-c) are adequately similar to the non-linear smooth function 610 to convert the output voltage signal 510 to the complemented dot-product operation value 450a. The second op-amp configuration voltage 540b may be adjusted such that the second op-amp configuration 530 converts the output voltage signal 510 to the dot-product operation value 470a.

In an embodiment, the first op-amp configuration 520 generating the complemented dot-product operation value 450a may act as a summing amplifier that also accounts for the slope and bias required of the approximate sigmoid activation function. The complemented dot-product operation value 450a may then be fed into the second op-amp configuration 530 that may be a unity gain amplifier to obtain the dot-product operation value 470a. Equation 15 depicts an example embodiment of the first op-amp configuration 520, $$y_j^- = -R_g \left( \sum_{i=1}^{N} [x_i \sigma_{ij}^+ - x_i \sigma_{ij}^-] + x_{N+1} \sigma_b \right). \quad (15)$$

The voltage $x_{N+1}=1$ may be used to drive the bias value b of the sigmoid function. The resistance $R_g$ may be the resistance of the programmable gain resistor $M_g$ that converts output voltage signal 510 to the actual dot-product operation value represented by the dot-product operation value 470a and the complemented dot-product operation value 450a. The value $\sigma_b$ is the conductance of the memristor $M_{N+1}$ and $\sigma_b = b/R_g$.

In Equation 16, $$R_g = m \frac{\max(W)}{(\sigma_{max} - \sigma_{min})} \quad (16)$$

$R_g$ may be set so that the summation of the conductance and voltage pairs is multiplied by the inverse of the scaling factor in equations 6 and 8 as well as the slope of the activation function m. As a result, the resulting complemented dot-product operation value 450a and the dot-product operation value 470a may have a value substantially equal to that of the dot-product operation performed by a conventional computing system after the activation function has been applied.

In Equation 17, the dot-product operation value 470a may be determined from the complemented dot-product operation value 450a, $$y_j^+ = -\frac{R_f}{R_f} y_j^- = -y_j^-. \quad (17)$$

Thus, the actual dot-product operation values may be generated from the dot product operation executed by the analog neuromorphic circuit 400. If additional layers of analog neuromorphic circuits are present, the dot-product operation value 470a may be provided to the additional analog neuromorphic circuit as $\sigma^+$ and the complemented dot-product operation value 450a may be provided to the additional analog neuromorphic circuit 400 as $\sigma^-$.

Figure 7:
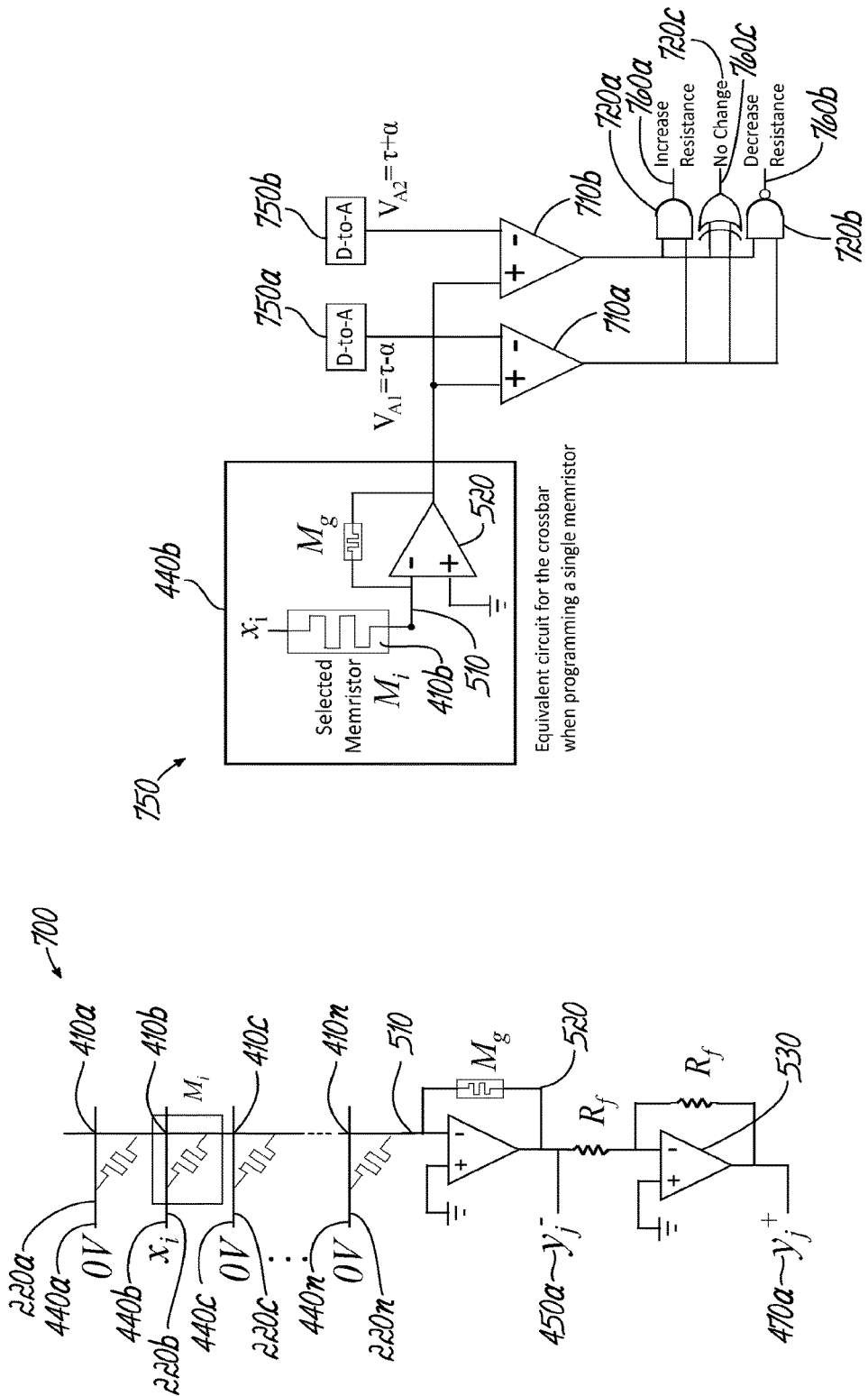
FIG. 7A is a schematic illustration of a resistance adjuster configuration as depicted with a column of the analog neuromorphic circuit that may be implemented to adjust the resistance values of the resistive memories in accordance with an embodiment of the disclosure.
FIG. 7B is a schematic illustration of a resistance adjuster that may determine whether each of the resistance values for each corresponding resistive memory have corresponding conductance values that are within the maximum conductance level $\sigma_{max}$ and the minimum conductance level $\sigma_{min}$ in accordance with an embodiment of the disclosure.

Referring to FIG. 7A, in which like reference numerals are used to refer to like parts, a resistance adjuster configuration 700 is depicted with a column of an analog neuromorphic circuit 400 that may be implemented to adjust the resistance values of the resistive memories 410(a-n) with the resistance adjuster 750 in FIG. 7B. The resistance adjuster configuration 700 and the resistance adjuster 750 include the plurality of resistive memories 410(a-n), the plurality of input voltages 440(a-n), the output voltage value 510, the first op-amp configuration 520, the second op-amp configuration 530, a first comparator 710a, a second comparator 710b, and resistance adjusters 720(a-c). The resistance adjuster configuration 700 and the resistance adjuster 750 share many similar features with the analog neuromorphic processing device 100, the analog neuromorphic circuit 200, the neural network configuration 300, the analog neuromorphic circuit 400, and the output configuration 500, therefore, only the differences between the resistance adjuster configuration 700 and the resistance adjuster 750 and the output configuration 500, the analog neuromorphic circuit 400, the analog neuromorphic processing device 100, the analog neuromorphic circuit 200, and the neural network configuration 300 are to be discussed in further detail.

After the minimum conductance level $\sigma_{min}$ and the maximum conductance level $\sigma_{max}$ for each pair of resistive memories have been determined, the resistance adjuster 750 in FIG. 7B may determine whether the resistance values for each corresponding resistive memories have corresponding conductance values that are within the maximum conductance level $\sigma_{max}$ and the minimum conductance level $\sigma_{min}$. The resistance adjuster 750 may then adjust the resistance values for each of the resistive memories that have corresponding conductance values that are outside of the maximum conductance level $\sigma_{max}$ and the minimum conductance level $\sigma_{min}$ such that the resistive values of those resistive memories have corresponding conductance values that are within the maximum conductance level $\sigma_{max}$ and the minimum conductance level $\sigma_{min}$. The adjusting of the resistance values of resistive memories by a resistance adjuster is discussed in detail in U.S. Nonprovisional application Ser. No. 15/202,995, which is incorporated herein by reference in its entirety.

In order to determine the current resistance value of a corresponding resistive memory, each of the input voltages 440(a-n) may be set to 0.0V. However, an input voltage may be applied to the horizontal row 220(a-n) where the resistive memory is positioned that has the requested current resistance value. For example, the current resistance value of the resistive memory 410b is requested. The resistive memory 410b is positioned on horizontal wire 220b. Each of the input voltages 440a, 440c, and 440n may be set to 0.0V while a positive voltage applied as input voltage 440b to the horizontal wire 220b. The output voltage value 510 is then based on the positive voltage applied as input voltage 440b to the resistive memory 410b due to each of the remaining input voltages 440a, 440c and 440n set to 0.0V, which fails to activate the resistance values of resistive memories 410a, 410c, and 410n. Thus, the output voltage value 510 is isolated to the resistive memory 410b and represents the current resistance value of the resistive memory 410b.

After the output voltage value 510 is applied to the first op-amp configuration 520a, the complemented dot-product operation value 450a is generated based on the single resistance value associated with resistive memory 410b. The complemented dot-product operation value 450a may then be applied to a first comparator 710a and a second comparator 710b. The maximum conductance voltage signal 750a and the minimum conductance voltage signal 750b may signify tolerance bounds around a target resistance value that is to be programmed by incorporating the resistance adjuster 750. The resistance adjuster 750 may program a resistance until the complemented dot-product operation value 450a from the first op-amp configuration 520 falls between the tolerance bounds that signify a maximum and minimum programmable conductance value that may differ from the conductance 490a and the conductance 490b, respectively. The maximum and minimum programmable conductance values may be tailored to each specific device such that the maximum and minimum programmable conductance values may differ between devices. However, the maximum conductance level $\sigma_{max}$ and the minimum conductance level $\sigma_{min}$ may be universal values among different devices and signify the maximum programming range for each of the different devices.

The complemented dot-product operation value 450a may then be compared to the maximum conductance voltage signal 750a as the complemented dot-product operation value 450a and the maximum conductance voltage signal 750a are applied to the first comparator 710a. The complemented dot-product operation value 450a may also be compared to the minimum conductance voltage signal 750b as the complemented dot-product operation value 450a and the minimum conductance voltage signal 750b are applied to the second comparator 710b.

The resistance adjuster 720a may then generate an increased resistance signal 760a when the complemented dot-product operation value 450a is less than the minimum conductance voltage signal 750a. The increased resistance signal 760a may then increase the resistance value of the resistive memory 410b until the resistance value corresponds to a conductance value that is within the maximum tolerable conductance level and the minimum tolerable conductance level. The resistance adjuster 720c may generate a no-change resistance signal 760c when the complemented dot-product operation value 450a is within the minimum conductance voltage signal 750a and the maximum conductance voltage signal 750b in which the current resistance value of the resistive memory 410b remains unchanged. The resistance adjuster 720b may generate a decreased resistance signal 760b when the complemented dot-product operation value 450a is above the maximum conductance voltage signal 750b. The decreased resistance signal 760b may then decrease the resistance value of the resistive memory 410b until the resistance value corresponds to a conductance value that is within the maximum tolerable conductance level and the minimum tolerable conductance level. The resistance values of each of the other resistive memories 410(a-n) may be determined in similar manner as resistive memory 410b and each of the resistive memories may be adjusted in a similar manner as resistive memory 410b.

The analog neuromorphic circuit 400 may be incorporated into analog neuromorphic configurations with other analog neuromorphic circuits to execute popular existing neural network algorithms. The crossbar configuration of the analog neuromorphic circuit 400 combined with the programmability capabilities of the resistive memories 410(a-n) may enable the development of highly efficient neural systems. In doing so, the crossbar configuration is capable of performing N×M convolution operations in parallel where N is equal to the number of input maps and M is equal to the number of output maps in a given layer of a CNN system. For example, the analog neuromorphic circuit 400 may be incorporated into analog neuromorphic configurations to execute popular neural network algorithms that include but are not limited to a Multilayer Perceptron (MLP), a Restricted Boltzmann Machine (RBM), and/or a CNN.

Figure 8:
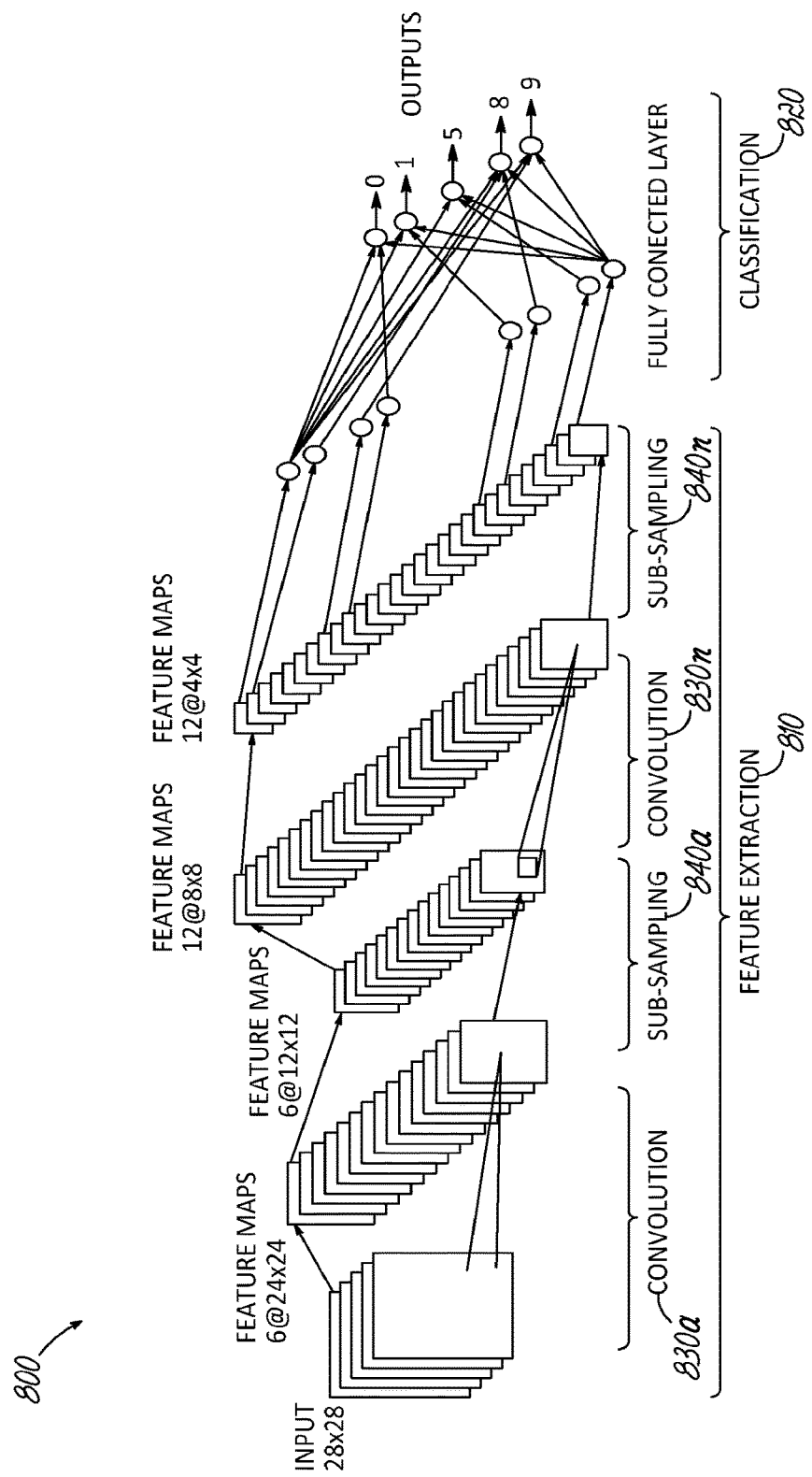
FIG. 8 is a schematic illustration of a conventional Convolutional Neural Network (CNN) that may be executed by analog neuromorphic configurations.

In executing each of the neural network algorithms, the weights of each of the resistive memories 410(a-n) may be determined as described in detail above by the controller 405 and then each of the resistive values for each of the resistive memories 410(a-n) may be then adjusted as described in detail above. Referring to FIG. 8, a conventional CNN 800 that may be executed by analog neuromorphic configurations that include the analog neuromorphic circuit 400 is depicted. The conventional CNN is a type of feed-forward neural network in which the connectivity pattern between the neurons of the conventional CNN attempt to replicate the organization of the animal visual cortex whose individual neurons are arranged in such a way that the neurons respond to overlapping regions tiling the visual field. The discussion below provides in detail how analog neuromorphic configurations that include the analog neuromorphic circuit 400 may be incorporated to execute the conventional CNN 800. However, analog neuromorphic configurations that include the analog neuromorphic circuit 400 may be incorporated to execute any other neural network algorithm that is apparent to those skilled in the art.

The conventional CNN 800 includes two main parts that are the feature extractor 810 and the classifier 820. The feature extractor 810 may include several layers with each layer of the neural network executing the feature extractor 810 receiving an input from the immediate previous layer. The feature extractor 810 includes the combination of two different types layers that are the convolution layers 830(a-n), where n is an integer equal to or greater than one, and the subsampling layers 840(a-n), where n is an integer equal to or greater than one. The outputs of the convolution layers 830(a-n) and the subsampling layers 840(a-n) are organized into multiple two-dimensional planes known as feature maps. The convolution layers 830(a-n) extract the features from the input images using convolution operations and the subsampling layers 840(a-n) abstract the feature maps through an averaging filter.

As the features propagate through the conventional CNN 800, the size of the features is reduced in terms of pixels depending on the size of the convolution kernels and the subsampling kernels applied to the features by each of the neural layers, respectively. However, the number of feature maps is also increased so the conventional CNN 800 may determine the most suitable features of the input images for better classification accuracy. The outputs of the last layer of the conventional CNN 800 are then input to a fully connected network that is the classifier 820.

Figure 9:
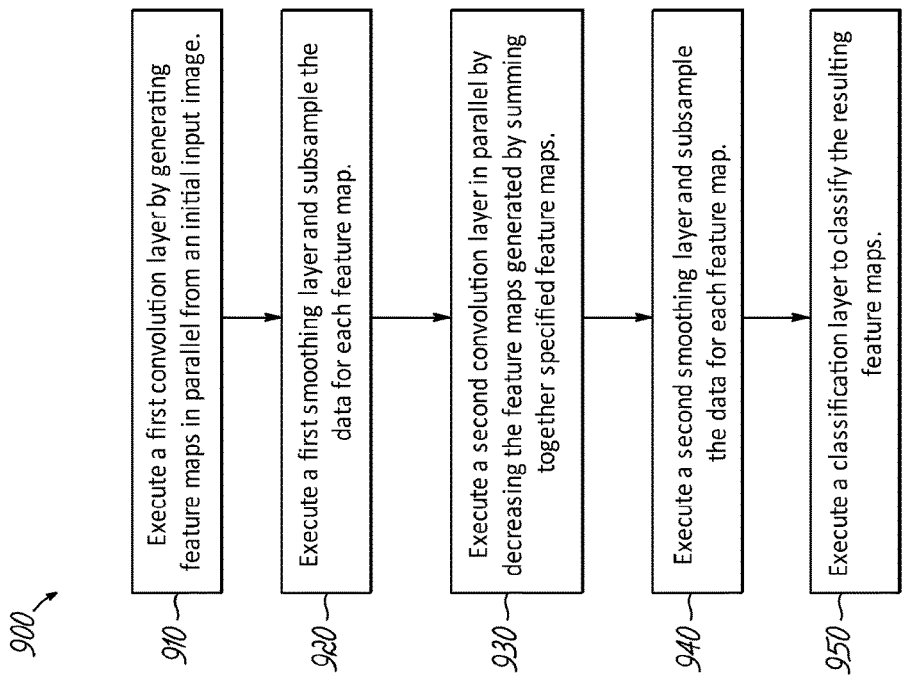
FIG. 9 is a flowchart that outlines an operation that may be performed by the analog neuromorphic circuit in accordance with an embodiment of the disclosure.

FIG. 9 is a flowchart of exemplary operational steps of an analog neuromorphic configuration that includes analog neuromorphic circuits similar to analog neuromorphic circuit 400 according to an exemplary embodiment of the present invention. For discussion purposes, the following exemplary operation steps are focused on the execution of the conventional CNN 800 where images are incorporated as inputs to the analog neuromorphic configuration. However, the present invention is not limited to this operational description. Rather, it will be apparent to persons skilled in the relevant art(s) from the teaching herein that other operational control flows are within the scope of the present invention. For example, other operational control flows that incorporate any image as inputs to the analog neuromorphic configuration may be implemented as well as implementing other neural network algorithms that differ from the conventional CNN 800. The following discussion describes the steps in FIG. 9.

At step 910, the operational control flow 900 executes a convolution layer by generating feature maps in parallel from an initial input image. Initially, an image is applied to the analog neuromorphic circuit 1000 depicted in FIG. 10. The analog neuromorphic circuit 1000 shares many similar features with the analog neuromorphic processing device 100, the analog neuromorphic circuit 200, the neural network configuration 300, the analog neuromorphic circuit 400, and the output configuration 500; therefore, only the differences between the analog neuromorphic circuit 1000 and the output configuration 500, the analog neuromorphic circuit 400, the analog neuromorphic processing device 100, the analog neuromorphic circuit 200, and the neural network configuration 300 are to be discussed in further detail.

The image applied to the analog neuromorphic circuit 1000 is represented as a pixel image. Attempting to correctly identify the entire pixel image may require significant amount of computation power that is unnecessary if the pixel image may be analyzed in portions while still correctly identifying the pixel image based on those analyzed portions. As a result, a convolution layer may be executed dividing the pixel image into feature maps where each feature map is a smaller portion of the pixel image while extracting the data from a portion of the pixels included in the pixel image rather than the data from each pixel included in the pixel image.

Figure 10:
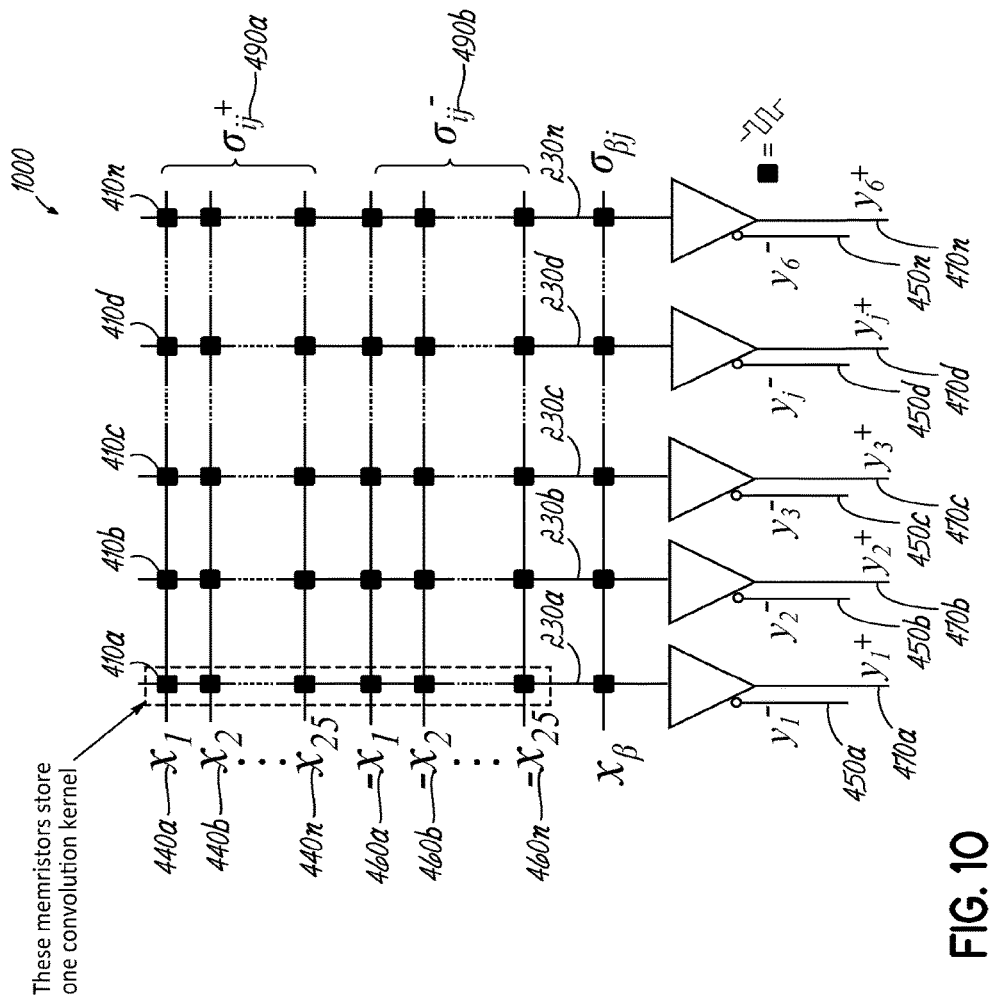
FIG. 10 is a schematic illustration of an analog neuromorphic circuit in accordance with an embodiment of the disclosure.

In this example, the initial image is a 28×28 pixel image. Rather than applying the entire 28×28 pixel image to the analog neuromorphic circuit 1000 as inputs, 5×5 sections of the 28×28 pixel image are selected such that 25 pixels included in each 5×5 section are applied to the analog neuromorphic circuit 1000 as inputs. For example, as shown in FIG. 10, each of the 25 pixels are applied to the analog neuromorphic circuit 1000 as the input voltages 440($a$-$n$), where n is equal to 25, and each complement of the 25 pixels are applied to the analog neuromorphic circuit 1000 as the complemented input voltages 460($a$-$n$), where n is equal to 25. The conductance 490$a$ and the conductance 490$b$ for each pair of the resistive memories 410($a$-$n$) may then be determined as discussed in detail above such that the resistive memories 410($a$-$n$) represent a 25-pixel filter that is applied to each 5×5 section of the 28×28 pixel image. In doing so, each 5×5 section of the 28×28 pixel image is multiplied by the 25-pixel filter represented by the resistance values of each resistive memory 410($a$-$n$) by simply changing the input voltages 440($a$-$n$) and the complemented input voltages 460($a$-$n$) to correspond to each 5×5 section of the 28×28 pixel image.

In this example, six feature maps with each feature map including 24×24 pixels are generated in parallel by the analog neuromorphic circuit 1000. The analog neuromorphic circuit 1000 includes the vertical wires 230($a$-$n$), where n is an integer equal to six, with resistive memories 410($a$-$n$) positioned on each vertical wire 230($a$-$n$) to correspond to the input voltages 440($a$-$n$) and the complemented input voltages 460($a$-$n$). As each of the 25 pixels for each of the 5×5 sections are applied to the analog neuromorphic circuit 1000 via the input voltages 440($a$-$n$) and the complemented input voltages 460($a$-$n$), the analog neuromorphic circuit 1000 generates dot-product operation values 470($a$-$n$), where n is an integer equal to six, and the complemented dot-product operation values 450($a$-$n$), where n is an integer equal to six. Each of the six dot-product operation values 470($a$-$n$) and the complemented dot-product operation values 450($a$-$n$) represent the six different feature maps generated in parallel during execution of the feature layer.

Thus, six different 24×24 pixel feature maps are generated by the analog neuromorphic circuit 1000 with each feature map including less pixels than the original 28×28 pixel image while incorporating sufficient data from the original 28×28 pixel image so that the original 28×28 pixel image may eventually be identified. The six different 24×24 pixel feature maps after being generated may then be stored in a digital storage layer as the output of the first convolution layer. A data controller may be incorporated to reduce the amount of memory required to store each of the six different 24×24 pixel feature maps following the execution of the first convolution layer. Any type of storage may be incorporated to store the six different 24×24 pixel feature maps following execution of the first convolution layer that is apparent to those skilled in the art. Although the above example depicts a 28×28 pixel image that is divided into 5×5 pixel portions and applied to a 25-pixel filter to generate six feature maps, the analog neuromorphic circuit 1000 may be modified to handle any size of an initial image while incorporating any size filter to generate any number of feature maps that is apparent to those skilled in the art.

At step 920, the operational control flow 900 executes a smoothing layer and subsamples the data for each feature map that is stored after completing the first convolution layer in step 910. Each of the feature maps generated by the analog neuromorphic circuit 1000 and represented as the dot-product operation values 470($a$-$n$) and the complemented dot-product operation values 450($a$-$n$) are then applied as inputs to the analog neuromorphic circuit 1100 depicted in FIG. 11. The analog neuromorphic circuit 1100 may then execute a smoothing operation where a single filter is applied to each of the feature maps. In doing so, the pixels included in each of the feature maps may be averaged so that the data represented by each pixel is averaged. The pixel size of each feature map may then be decreased with a subsampling operation where a portion of the averaged pixels for each feature map are selected such that the important data of each feature map is carried forward as outputs of the analog neuromorphic circuit 1100 so that the original image may be eventually identified.

The analog neuromorphic circuit 1100 shares many similar features with the analog neuromorphic processing device 100, the analog neuromorphic circuit 200, the neural network configuration 300, the analog neuromorphic circuit 400, the output configuration 500, and the analog neuromorphic circuit 1000 therefore, only the differences between the analog neuromorphic circuit 1100 and the analog neuromorphic circuit 1000, the output configuration 500, the analog neuromorphic circuit 400, the analog neuromorphic processing device 100, the analog neuromorphic circuit 200, and the neural network configuration 300 are to be discussed in further detail.

For example, six feature maps are generated as dot-product operation values 470($a$-$n$) and complemented dot-product operation values 450($a$-$n$) with each feature map including 24×24 pixels. Each of the six feature maps are then applied as inputs to each individual analog neuromorphic circuit 1110($a$-$n$), where n is equal to six. Since each of the feature maps include 24×24 pixels, each feature map is divided into 4×4 sections and each 4×4 section is applied as input voltages 440($a$-$n$), where n is an integer equal to four, and complemented input voltages 460($a$-$n$), where n is an integer equal to four. In this example, the first 4×4 section of the first feature map is applied as input voltage 440($a$1-$n$1) and as complemented input voltage 460($a$1-$n$1) to the individual analog neuromorphic circuit 1110$a$. Each 4×4 section for each feature map is applied to the corresponding individual analog neuromorphic circuit 1110($b$-$n$), where n is equal to 6, in a similar manner.

The smoothing filter applied to each 4×4 section of each feature map may be executed by each individual analog neuromorphic circuit 1110($a$-$n$) by adjusting the conductance 490$a$ and the conductance 490$b$ for each pair of the resistive memories 410($a$-$n$) included in each of the individual analog neuromorphic circuits 1100($a$-$n$). The conductance 490$a$ and the conductance 490$b$ for each resistive memory 410($a$-$n$) included in each of the individual analog neuromorphic circuits 1100($a$-$n$) may be adjusted such that each of the feature maps are multiplied by the smoothing filter incorporated into each corresponding individual analog neuromorphic circuit 1110(*a-n*).

In this example, the conductance 490*a*1 and the conductance 490*b*1 may be adjusted such that resistance values for each of the resistive memories 410(*a*1-*n*1) represent the smoothing filter applied by the individual analog neuromorphic circuit 1110*a* to the first feature map. Each of the conductance and conductance for each of the resistive memories included in each of the individual analog neuromorphic circuits 1100(*b-n*) may be adjusted in a similar manner such that each corresponding feature map is multiplied by the smoothing filter. In this example, the smoothing filter applied to each filter may be determined according to Equation 18, $$k = \begin{matrix} \frac{1}{4} & \frac{1}{4} \\ \frac{1}{4} & \frac{1}{4} \end{matrix}. \qquad (18)$$

The pixel size of each feature map may also be decreased with a subsampling operation where a portion of the averaged pixels for each feature map are selected. In doing so, a portion of the dot-product operation values 470(*a-n*) and the complemented dot-product operation values 450(*a-n*) generated by each of the individual analog neuromorphic circuits 1110(*a-n*) are selected to be incorporated into a reduced feature map. For example, the subsampling operation reduces the pixel size of each feature map by a factor of two in which every other dot-product operation value 470 (*a-n*) and the complemented dot-product operation values 450(*a-n*) generated by each of the individual analog neuromorphic circuits 1110(*a-n*) are selected to be incorporated into a reduced feature map. Each of the selected dot-product operation values 470(*a-n*) and the selected complemented dot-product operation values 450(*a-n*) generated by each of the individual analog neuromorphic circuits 1110(*a-n*) may then be stored in a digital storage layer as the output of the first smoothing and subsampling layer. Any type of storage may be incorporated to store the selected dot-product operation values 470(*a-n*) and the selected complemented dot-product operation values 450(*a-n*) generated by each of the individual analog neuromorphic circuits 1110(*a-n*) following the execution of the first smoothing and subsampling layer that is apparent to those skilled in the art.

In this example, every other dot-product operation value 470*a*1 and every other complemented dot-product operation value 450*n*1 as generated by the individual analog neuromorphic circuit 1110*a* is selected to be incorporated into a reduced feature map and stored following the selection. The dot-product operation values 470(*a-n*) and the complemented dot-product operation values 450(*a-n*) for each of the individual analog neuromorphic circuits 1110(*b-n*) may be selected to be incorporated into the reduced feature map and stored following the selection in a similar manner. Thus, each of the six 24×24 pixel maps is reduced to six 12×12 reduced pixel maps due to the smoothing and subsampling performed by the analog neuromorphic circuit 1100. In doing so, the pixel size of each feature map is decreased such that the important data of each feature map is carried forward and stored as outputs of the analog neuromorphic circuit 1100 so that the original image may be eventually identified.

Although the above example depicts six 24×24 feature maps divided into 4×4 pixel portions and applied to a 4×4 pixel filter as depicted in Equation 18 and sampled by a factor of 2, the analog neuromorphic circuit 1100 may be modified to handle any quantity and any size of feature maps while incorporating any size filter as well as any type of filter and any factor of sampling to generate any number of reduced pixel sets that is apparent to those skilled in the art.

Figure 12:
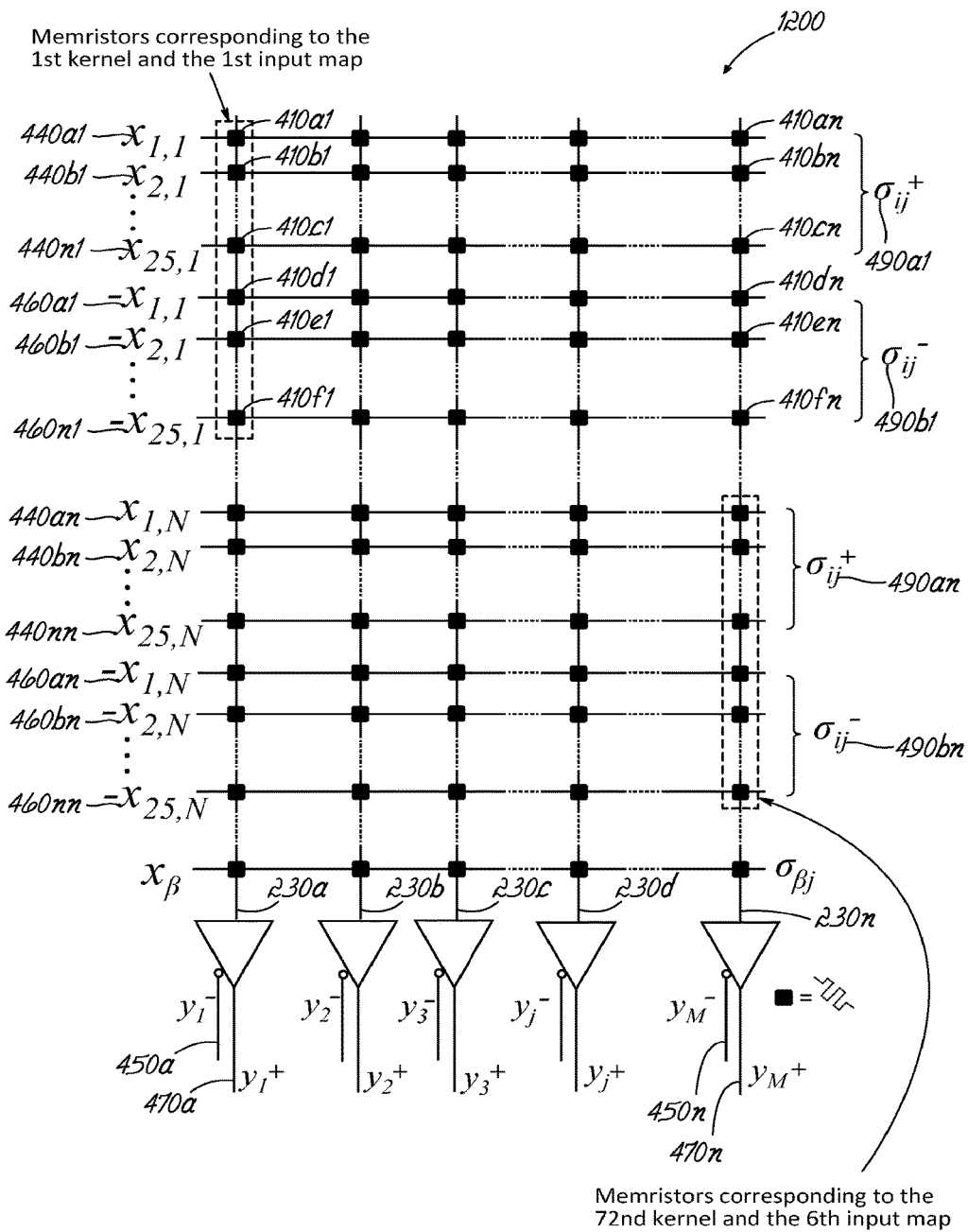
FIG. 12 is a schematic illustration of an analog neuromorphic circuit in accordance with an embodiment of the disclosure.

At step 930, the operational control flow 900 executes a second convolution layer in parallel by decreasing the reduced pixel maps generated by summing together specified reduced pixel maps based on the selected dot-product operation values 470(*a-n*) and the complemented dot-product operation values 450(*a-n*) stored in step 920. Each of the reduced pixel maps generated by the analog neuromorphic circuit 1100 and represented by the dot-product operation values 470(*a-n*) and the complemented dot-product operation values 450(*a-n*) are then applied as inputs to the analog neuromorphic circuit 1200 as depicted in FIG. 12. The analog neuromorphic circuit 1200 may then execute a second convolution layer where each of the reduced pixel maps applied to the analog neuromorphic circuit 1200 are multiplied in parallel by different kernels with each kernel represented by the resistance values of the corresponding resistive memories 410(*a-n*) associated with each vertical wire 230(*a-n*).

The amount of feature maps generated by the second convolution layer as represented by the dot-product operation values 470(*a-n*) and the complemented dot-product operation values 450(*a-n*) of the analog neuromorphic circuit 1200 may then be reduced. Each of the feature maps represented by the dot-product operation values 470(*a-n*) and the complemented dot-product operation values 450(*a-n*) may be grouped together into groups and then each of the feature maps included in a corresponding group may be summed together to generate a grouped feature map that represents the feature maps included in each group and thereby reduce the amount of feature maps generated by the analog neuromorphic circuit 1200. The feature maps generated by the analog neuromorphic circuit 1200 after executing the second convolution layer may also have a decreased pixel size as compared to the feature maps initially provided as inputs to the analog neuromorphic circuit 1200 such that the important data of each feature map is carried forward as outputs of the analog neuromorphic circuit 1200 so that the original image may be eventually identified.

The analog neuromorphic configuration 1200 shares many similar features with the analog neuromorphic processing device 100, the analog neuromorphic circuit 200, the neural network configuration 300, the analog neuromorphic circuit 400, the output configuration 500, the analog neuromorphic circuit 1000, and the analog neuromorphic circuit 1100, therefore, only the differences between the analog neuromorphic circuit 1200 and the analog neuromorphic circuit 1100, the analog neuromorphic circuit 1000, the output configuration 500, the analog neuromorphic circuit 400, the analog neuromorphic processing device 100, the analog neuromorphic circuit 200, and the neural network configuration 300 are to be discussed in further detail.

For example, as noted above, six reduced pixel maps are generated by the analog neuromorphic circuit 1100 as dot-product operation values 470(*a-n*) and complemented dot-product operation values 450(*a-n*) with each reduced pixel map including 12×12 pixels. Each of the six reduced pixel maps are then applied as inputs to the analog neuromorphic circuit 1200(*a-n*), where n is equal to six. Since each of the six reduced pixel maps include 12×12 pixels, each reduced pixel map is applied as input voltages 440(*a-n*), where n is an integer equal to twelve, and complemented input voltages 460(*a-n*), where n is an integer equal to equal to twelve. In this example, the first reduced pixel map is applied as input voltages 440(*a*1-*n*1) and as complemented input voltages 460(*a*1-*n*1) to the analog neuromorphic circuit 1200. Each reduced pixel map is applied to the analog neuromorphic circuit 1200 in a similar manner as shown where the sixth reduced pixel map is applied as input voltages 440(*an-nn*), where n is an integer equal to twelve, and as complemented input voltages 460(*an-nn*), where n is an integer equal to twelve.

Different kernels are then applied to each of the reduced pixel maps that are applied as inputs to the analog neuromorphic circuit 1200. Each kernel is represented by resistance values associated with each of the corresponding resistive memories 410(*a-n*) included in a corresponding vertical wire 230(*a-n*). For example, a first kernel is represented by the resistance values associated with resistive memories 410(*a*1-*f*1) that is applied to the first reduced pixel map applied to the analog neuromorphic circuit 1200 as input voltages 440(*a*1-*n*1) and as complemented input voltages 460(*a*1-*n*1). As can be seen, the first kernel includes each of the resistive memories 410(*a*1-*f*1) that is positioned on the vertical wire 230*a*. In this example, a twelfth kernel is represented by resistance values associated with each of the corresponding resistive memories 410(*an-fn*), where n is an integer equal to twelve. As can be seen, the twelfth kernel includes each of the resistive memories 410(*an-fn*) that is positioned on the vertical wire 230*n*, where n is an integer equal to twelve. The positioning of each of the resistive memories 410(*a-n*) on a corresponding vertical wire 230(*a-n*) to establish each of the different kernels as well as the simultaneous application of each of the different reduced pixel maps as inputs to the analog neuromorphic circuit 1200 enables the execution of the second convolution layer where each of the different feature maps are simultaneously multiplied by each of the different kernels to be executed in parallel.

Each of the kernels applied to each of the reduced pixel maps may be executed by the analog neuromorphic circuit 1200 by adjusting each of the conductance values 490(*a*1-*an*), where n is an integer equal to twelve, and each of the conductance values 490(*an-bn*), where n is an integer equal to twelve, for each pair of resistive memories applied to each of the reduced pixel maps. The conductance values 490(*a*1-*an*) and the conductance values 490(*an-bn*) for each of the corresponding resistive memories applied to each of the corresponding reduced pixel maps such that each of the reduced pixel maps are multiplied by each of the different kernels as positioned on each of the corresponding vertical wires 230(*a-n*).

In this example, the conductance 490*a*1 and the conductance 490*b*1 may be adjusted such that resistance values for each of the resistive memories 410(*a*1-*fn*) that represent each of the different kernels applied by the analog neuromorphic circuit 1200 to the first reduced pixel map. Each of the conductance values 490(*a*2-*an*) and conductance values 490(*b*2-*bn*) for each of the resistive memories included in the analog neuromorphic circuit 1200 may be adjusted in a similar manner such that each corresponding reduced pixel map is multiplied by each of the different filters.

The application of different kernels to each of the different reduced pixel maps via the analog neuromorphic circuit 1200 may result in a significant amount of output feature maps with a significant portion of those output feature maps being unnecessary to eventually correctly identify the pixel image. For example, the six different reduced pixel maps applied as inputs to the analog neuromorphic circuit 1200 that are simultaneously multiplied with twelve different kernels result in 72 different convolutions that are performed generating 72 different output feature maps by the analog neuromorphic circuit 1200. However, 72 different output feature maps are unnecessary to eventually correctly identify the pixel image.

Rather than generate significant amount of unnecessary output feature maps, each of the output feature maps may be grouped together into different groups where each of the feature maps included in a group may be summed together to generate a single output feature map that is representative of the group. Each group may then have a single grouped output feature map associated with the corresponding group such that each of the grouped output feature maps may then be generated as outputs of the analog neuromorphic circuit 1200. Thus, the significant quantity of originally generated output feature maps may be significantly reduced to the grouped output feature maps. Each of the single grouped feature map associated with the corresponding group may then be stored in a digital storage layer as the output of the second convolution layer. Any type of storage may be incorporated to store the single grouped feature maps following the execution of the second convolution layer that is apparent to those skilled in the art.

For example, each of the 72 different output feature maps generated by the simultaneous multiplication of the six different feature maps with the twelve different kernels may be grouped together such that six of the 72 output feature maps are included in a single group. Thus, twelve different groups may be generated by grouping the 72 output feature maps into groups of six. Each of the output feature maps included in a group may then be summed together to generate the grouped output feature map that is representative of each of the six output feature maps included in the group such that each of the twelve different groups may generate twelve different grouped output feature maps and then stored.

As noted above, each of the twelve different kernels are positioned on a corresponding vertical wire 230(*a-n*) resulting in twelve different vertical wires 230(*a-n*) with each of the twelve different vertical wires 230(*a-n*) generating a corresponding output value represented by the dot-product operation values 470(*a-n*), where n is an integer equal to twelve, and complemented dot-product operation values 450(*a-n*), where n is an integer equal to twelve. As a result, each of the twelve different grouped output feature maps generated by the grouping the 72 different output feature maps into groups of six may be represented by each of the corresponding the dot-product operation values 470(*a-n*) and complemented dot-product operation values 450(*a-n*) generated by each of the vertical wires 230(*a-n*).

In this example, the grouping of the output feature maps may be implemented in Equation 19 where i=1, . . . N and N is equal to the number of input maps (N=6). Likewise, j=1, . . . , M and M is equal to the number of output maps (M=12). Each $X_i$ denotes an entire input array containing 25 elements, and each $K_{ij}$ denotes an entire kernel array containing 25 elements.

$$v_j = (X_1 * K_{1j}) + (X_i * K_{ij}) + \ldots + (X_N * K_{Nj}). \quad (19)$$

Since convolution (denoted by *) is a linear operation, the equation may be rearranged so that the entire process may be completed in a single crossbar column as in equation 20, $$v_j = [X_1, \ldots X_i, \ldots, X_N] * [K_{1j}, \ldots, K_{ij}, \ldots K_{Nj}]. \quad (20)$$

Thus, the outputs of the analog neuromorphic circuit 1200 after executing the second convolution layer may include an additional set of feature maps each with a decreased pixel size from the feature maps initially applied as inputs to the analog neuromorphic circuit 1200. In this example, the outputs of the analog neuromorphic circuit 1200 after executing the second convolution layer include twelve 8×8 pixel feature maps that are reduced from the initial 12×12 pixel feature maps applied as inputs to the analog neuromorphic circuit 1200. In doing so, the important data of each feature map is carried forward as outputs of the analog neuromorphic circuit 1200 and stored in a digital storage layer so that the original image may be eventually identified.

Although the above example depicts six 12×12 feature maps simultaneously inputted to the analog neuromorphic circuit 1200 and simultaneously multiplied by twelve different kernels generating 72 different output feature maps that are then grouped into twelve different grouped output feature maps each including six different output feature maps, the analog neuromorphic circuit 1200 may be modified to handle any quantity and any size of feature maps while incorporating any amount of kernels as well as grouping output feature maps into any quantity of groups including any quantity of output feature maps to generate any quantity of grouped output feature maps that is apparent to those skilled in the art.

At step 940, the operational control flow 900 executes a second smoothing layer and subsamples the data for each feature map based on the grouped output feature maps stored in step 930. Similar to step 920, an analog neuromorphic configuration similar to the analog neuromorphic circuit 1100 may be implemented to execute the smoothing layer and subsampling executed in step 920. However, in this example, rather than having six feature maps applied as inputs to each individual analog neuromorphic circuit similar the individual analog neuromorphic circuits 1110(*a-n*), twelve feature maps as were outputted by the analog neuromorphic circuit 1200 in step 930 are applied as inputs such that n is equal to twelve rather than six as in step 920. Rather than each of the feature maps including 24×24 pixels as in step 920, each of the feature maps as outputted by the analog neuromorphic circuit 1200 in step 930 include 8×8 pixels. Each of the 8×8 pixel feature maps are then reduced and stored in a similar manner as the smoothing and subsampling executed in step 920 where each of the 8×8 pixel maps are reduced to twelve different 4×4 pixel maps that are then stored in a digital storage layer.

At step 950, the operational control flow 900 executes a classification layer to classify the resulting feature maps stored in step 940. As noted above with regards to step 940, several feature maps are generated as outputs after the second smoothing layer and subsampling is executed with each of those feature maps including a pixel size that has been reduced further. The feature maps generated by step 940 may include a reduced pixel size such that each of those feature maps may be easily applied as inputs to an analog neuromorphic circuit similar to that of the analog neuromorphic circuit 400 shown in FIG. 4. However, each of the feature maps applied as inputs to the analog neuromorphic circuit 400 may still include sufficient information such that the dot-product operation values 470(*a-n*) and complemented dot-product operation values 450(*a-n*) adequately identify the original pixel image applied to the analog neuromorphic circuit 1000 depicted in FIG. 10 in step 910.

Each of the values included in each of the feature maps may be applied to the analog neuromorphic circuit 400 as input voltages 440(*a-n*) and complemented input voltages 460(*a-n*). For example, twelve different 4×4 pixel feature maps as generated as outputs in step 940 may be applied to the analog neuromorphic circuit 400. In such an example, each of the twelve different 4×4 pixel feature maps include sixteen different values resulting in 192 input values to the analog neuromorphic circuit 400 as input voltages 440(*a-n*), where n is an integer equal to 192, and complemented input voltages 460(*a-n*), where n is an integer equal to 192.

The analog neuromorphic circuit 400 may then include a quantity of vertical wires 230(*a-n*) that correspond to the quantity of outputs that the analog neuromorphic circuit 400 may generate. For example, the initial 24×24 pixel image applied to the analog neuromorphic circuit 1000 in step 910 may be an image of a handwritten digit included in the Mixed National Institute of Standards and Technology (MNIST) database which includes images of handwritten digits ranging from 0 through 9. In such an example, the analog neuromorphic circuit may include ten different vertical wires 230(*a-n*), where n is an integer equal to ten, to correspond to the ten possible outputs that may be generated corresponding to the 10 different handwritten digits (0-9) that may be applied as the initial 24×24 pixel image.

Each of the resistance values for each of the corresponding resistive memories included in the analog neuromorphic circuit 400 may be adjusted based on the conductance 490*a* and the conductance 490*b* as discussed in detail above with regard to FIG. 4. As each of the 192 values associated with each of the twelve 4×4 pixel maps are applied as inputs to the analog neuromorphic circuit 400, each of the dot-product operation values 470(*a-n*), where n is an integer equal to ten, and complemented dot-product operation values 450(*a-n*), where n is an integer equal to ten, may correspond to the appropriate handwritten digit applied as the initial 24×24 pixel image in step 910. For example, the initial 24×24 pixel image applied to the analog neuromorphic circuit in step 910 may be the handwritten image of "1". The dot-product operation value 470*b* and the complemented dot-product operation value 450*b* may output a "high" voltage signal while the remaining dot-product operation values 470(*a, c-n*) and complemented dot-product operation values 450(*a, c-n*) depict a "low" voltage signal thus recognizing that the initial 24×24 pixel image applied to the analog neuromorphic circuit in step 910 is the handwritten image of "1".

As noted above regarding FIGS. 9 and 10, the initial image that is applied to the analog neuromorphic circuit 1000 as discussed regarding step 910, is applied as inputs to the analog neuromorphic circuit 1000 in sections to generate the feature maps as outputs of the analog neuromorphic circuit 1000. As discussed in the example above, the initial 28×28 pixel image is applied to the analog neuromorphic circuit 1000 as inputs in 5×5 pixel sections to generate the six different 24×24 pixel feature maps as outputs of the analog neuromorphic circuit 1000. Further as discussed in the example above, each of the six different 24×24 pixel feature maps generated as outputs of the analog neuromorphic circuit 1000 may then be stored in a digital storage layer of the first convolution layer until the first smoothing layer and subsampling of the six different feature maps is executed in step 920.

Rather than break the initial image that is applied to the analog neuromorphic circuit 1000 as inputs into sections and then digitally store each of the feature maps generated as outputs, the entire initial image may be applied to the analog neuromorphic circuit as inputs without having to break the initial image into sections to generate each of the feature maps. In doing so, multiple output feature maps may be generated in a single processing cycle rather than having each of the different sections of the initial image be applied to the kernel represented by the resistive memories 410(*a-n*)

included in the analog neuromorphic circuit 1000. The application of the initial image to the analog neuromorphic circuit in a single processing cycle without applying the initial image in sections may also eliminate the need to digitally store each of the output feature maps until the first smoothing layer and subsampling of the output feature maps is executed.

As discussed in the example above regarding the initial embodiment of step 910 and shown in FIG. 10, the analog neuromorphic circuit 1000 is a 51×6 resistive memory 410(*a-n*) crossbar where 5×5 pixel sections of the 28×28 pixel initial image is applied as input voltages 440(*a-n*) and complemented input voltages 460(*a-n*) in order to generate the six different 24×24 pixel feature maps. In doing so, six different 5×5 convolution kernels may be represented by the 51×6 resistive memory 410(*a-n*) crossbar and applied to each of the 5×5 pixel sections of the 28×28 pixel initial image to generate the six different 24×24 pixel feature maps. However, in a first alternative embodiment regarding step 910, the entire 28×28 pixel initial image may be applied to the analog neuromorphic circuit to generate the six different 24×24 feature maps. In doing so, six different 5×5 convolution kernels may be represented by six different crossbars with each crossbar including 1569×576 of resistive memories and applied to the entire 28×28 pixel initial image to generate the six different 24×24 feature maps in a single cycle.

In executing the first alternative embodiment for step 910, the mapping of the convolution kernels onto the analog neuromorphic circuit differs from the mapping of the convolution kernels onto the analog neuromorphic circuit 1000 as discussed in the initial embodiment of step 910. The mapping of the convolution kernels onto the analog neuromorphic circuit 1000 as discussed in initial embodiment of step 910 is discussed in the detailed example above regarding a 3×3 kernel where the 3×3 kernel example is used for simplicity in discussion purposes. The 3×3 kernel in Equation 21 is stored in a column of the analog neuromorphic circuit so that each input value is aligned with the correct kernel value:

$$k_{ex} = \begin{bmatrix} 0.1 & -0.2 & 0.3 \\ -0.4 & 0.5 & -0.6 \\ 0.7 & -0.8 & 0.9 \end{bmatrix} \rightarrow \begin{pmatrix} 0.9 \\ -0.6 \\ 0.3 \\ -0.8 \\ 0.5 \\ -0.2 \\ 0.7 \\ -0.4 \\ 0.1 \end{pmatrix} \rightarrow \begin{pmatrix} k_{ex}^+ & k_{ex}^- \\ 0.9 & 0 \\ 0 & 0.6 \\ 0.3 & 0 \\ 0 & 0.8 \\ 0.5 & 0 \\ 0 & 0.2 \\ 0.7 & 0 \\ 0 & 0.4 \\ 0.1 & 0 \end{pmatrix}. \quad (21)$$

Furthermore, the kernel array is converted into two arrays, $k_{ex}^+$ and $k_{ex}^-$, so that the analog neuromorphic circuit may account for kernels that have both positive and negative values. Similarly, the 3×3 pixel image as discussed in the detailed example above may be converted into two arrays of identical values with reverse sign as shown in Equation 22:

$$x_{ex} = \begin{bmatrix} 0 & 0.5 & 0.3 \\ 0.5 & 0.8 & 0.5 \\ 0 & 0.5 & 0 \end{bmatrix} \rightarrow \begin{pmatrix} 0 \\ 0.5 \\ 0.3 \\ 0.5 \\ 0.8 \\ 0.5 \\ 0 \\ 0.5 \\ 0 \end{pmatrix} \rightarrow \begin{pmatrix} x_{ex} & -x_{ex} \\ 0 & 0 \\ 0.5 & -0.5 \\ 0.3 & -0.3 \\ 0.5 & -0.5 \\ 0.8 & -0.8 \\ 0.5 & -0.5 \\ 0 & 0 \\ 0.5 & -0.5 \\ 0 & 0 \end{pmatrix}. \quad (22)$$

However, regarding the first alternative embodiment to step 910, each of the convolution kernels may be expanded into large sparse matrices as compared Equation 21 above. For example, the 3×3 convolution kernel, $k_{ex}$ as shown in Equation 22 used for simplicity in discussion purposes, displays how $k_{ex}$ may be converted into $k_{exp}^+$ and $k_{exp}^-$ to account for kernels that have positive and negative values:

$$k_{ex} = \begin{bmatrix} 0.1 & -0.2 & 0.3 \\ -0.4 & 0.5 & -0.6 \\ 0.7 & -0.8 & 0.9 \end{bmatrix} \rightarrow \quad (23)$$

$$\begin{pmatrix} k_{exp}^+ & & & & k_{exp}^- & & & \\ 0.9 & 0 & 0 & 0 & 0 & 0 & 0 & 0 \\ 0 & 0.9 & 0 & 0 & 0.6 & 0 & 0 & 0 \\ 0.3 & 0 & 0 & 0 & 0 & 0.6 & 0 & 0 \\ 0 & 0.3 & 0 & 0 & 0 & 0 & 0 & 0 \\ 0 & 0 & 0.9 & 0 & 0.8 & 0 & 0 & 0 \\ 0.5 & 0 & 0 & 0.9 & 0 & 0.8 & 0.6 & 0 \\ 0 & 0.5 & 0.3 & 0 & 0.2 & 0 & 0 & 0.6 \\ 0 & 0 & 0 & 0.3 & 0 & 0.2 & 0 & 0 \\ 0.7 & 0 & 0 & 0 & 0 & 0 & 0.8 & 0 \\ 0 & 0.7 & 0.5 & 0 & 0.4 & 0 & 0 & 0.8 \\ 0.1 & 0 & 0 & 0.5 & 0 & 0.4 & 0.2 & 0 \\ 0 & 0.1 & 0 & 0 & 0 & 0 & 0 & 0.2 \\ 0 & 0 & 0.7 & 0 & 0 & 0 & 0 & 0 \\ 0 & 0 & 0 & 0.7 & 0 & 0 & 0.4 & 0 \\ 0 & 0 & 0.1 & 0 & 0 & 0 & 0 & 0.4 \\ 0 & 0 & 0 & 0.1 & 0 & 0 & 0 & 0 \end{pmatrix}.$$

Further for this smaller scale example for simplicity in discussion purposes, the initial image, $x_{ex}$, is a 4×4 pixel image that may be converted into $x_{exp}$ and $-x_{exp}$ which are vector versions of the input image, $x_{ex}$, as shown in Equation 24:

$$x_{ex} = \begin{pmatrix} x_1 & \cdots & x_4 \\ \vdots & \ddots & \vdots \\ x_{13} & \cdots & x_{16} \end{pmatrix} \rightarrow \begin{pmatrix} x_{exp} & -x_{exp} \\ x_1 & -x_1 \\ \vdots & \vdots \\ x_{16} & -x_{16} \end{pmatrix}. \quad (24)$$

The initial image, $x_{ex}$, includes 16 elements that is then converted into vector versions $x_{exp}$ and $-x_{exp}$, which are then multiplied by each kernel matrix, $k_{exp}^+$ and $k_{exp}^-$, that includes 16 rows, respectively. Since the convolution kernel, $k_{ex}$, has the dimensions of 3×3 and the initial image $x_{ex}$, has the dimensions of 4×4, the resulting output feature map may have the dimensions of 2×2 resulting in the kernel matrices of $k_{exp}^+$ and $k_{exp}^-$ having 4 columns corresponding to each output value.

Thus, the mapping of the convolution kernels onto the analog neuromorphic circuit regarding the first alternative embodiment to step 910 as shown by Equation 23 depicts several different column outputs depicted by $k_{exp}^+$ and $k_{exp}^-$ as compared to the single column output of $k_{exp}^+$ and $k_{exp}^-$ as shown by Equation 21 for the initial embodiment of step 910. Rather than having a single column output of $k_{exp}^+$ and $k_{exp}^-$ for the initial embodiment of step 910 where different sections of the initial image is applied to the analog neuromorphic circuit 1000 to generate the different feature maps, the several different column outputs of $k_{exp}^+$ and $k_{exp}^-$ for the first alternative embodiment of step 910 enables the entire initial image to be applied to the analog neuromorphic circuit to generate different feature maps in a single cycle. As noted above, although the above example depicts a 28×28 pixel image that is divided into 5×5 pixel portions and applied to a 25-pixel filter to generate six feature maps, the analog neuromorphic circuit may be modified to handle any size of an initial image while incorporating any size filter to generate any number of feature maps that is apparent to those skilled in the art.

As noted above regarding FIGS. 9 and 11, each of the different feature maps is applied to the analog neuromorphic circuit 1100 as discussed regarding step 920, is applied as inputs to the analog neuromorphic circuit 1100 in sections as well as a selection of output values of the analog neuromorphic circuit 1100 in executing the subsampling to generate the reduced pixel maps as outputs of the analog neuromorphic circuit 1100. As discussed in the example above, each of the six 24×24 pixel feature maps is applied to a corresponding individual analog neuromorphic circuit 1110(a-n) as inputs in 4×4 pixel sections.

For example, the first 24×24 pixel feature map is applied to the individual analog neuromorphic circuit 1110a in 4×4 sections, the second 24×24 pixel feature map is applied to the individual analog neuromorphic circuit 1110b in 4×4 sections and so on. In doing so, the first smoothing layer may be applied to each of the six 24×24 pixel feature maps in parallel. Further as discussed in the example above, the pixel size of feature maps may be decreased with a subsampling operation where a portion of the averaged pixels for each feature map are selected. Further as discussed in the example above, each of the six different 12×12 reduced pixel maps generated as outputs of the analog neuromorphic circuit 1100 may then be stored in a digital storage layer of the first smoothing layer and subsampling until the second convolution layer of the six different reduced pixel maps is executed in step 930.

Figure 13:
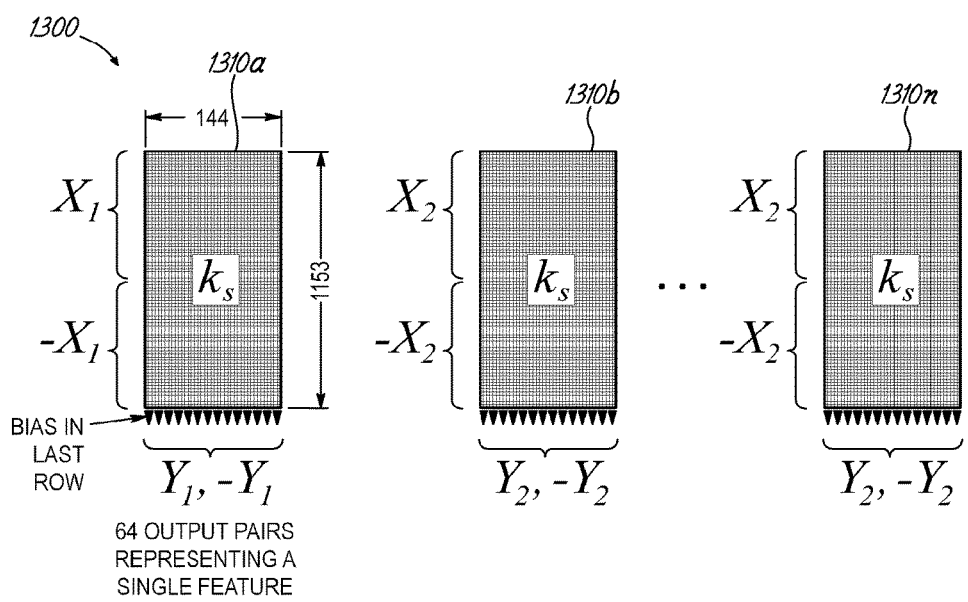
FIG. 13 is a schematic illustration of an analog neuromorphic circuit where the entire image may be applied as inputs without having to break each of the feature maps into sections to generate each of the reduced pixel maps in accordance with an embodiment of the disclosure.

Rather than break each of the feature maps that are applied to the analog neuromorphic circuit 1100 as inputs into sections and then digitally store each of the reduced pixel maps generated as outputs as well as perform the subsampling in selecting a portion of the output values, the entire image may be applied to the analog neuromorphic circuit 1300 as depicted in FIG. 13 as inputs without having to break each of the feature maps into sections to generate each of the reduced pixel maps. Further, rather than generating feature maps with values that are then selected to generate the reduced pixel maps via subsampling, the columns of the convolution kernel matrixes, $k_{exp}^+$ and $k_{exp}^-$ in Equation 23, as generated in the first convolution layer presented in the first alternative embodiment of step 910 that would be removed via the subsampling are simply not carried over and applied to the analog neuromorphic circuit 1300 as inputs. As the output values corresponding to those inputs to the analog neuromorphic circuit 1300 would be eliminated regardless in a subsampling operation. The application of each feature map to the analog neuromorphic circuit 1300 in a single processing cycle without applying the feature maps in sections as well as not having to perform the subsampling via selecting the output values of the analog neuromorphic circuit 1300 may also eliminate the need to digitally store each of the output feature maps until the second convolution layer of the reduced pixel maps is executed.

The analog neuromorphic circuit 1300 shares many similar features with the analog neuromorphic processing device 100, the analog neuromorphic circuit 200, the neural network configuration 300, the analog neuromorphic circuit 400, the output configuration 500, the analog neuromorphic circuit 1000, the analog neuromorphic circuit 1100, and the analog neuromorphic circuit 1200, therefore, only the differences between the analog neuromorphic circuit 1300 and the analog neuromorphic circuit 1200, the analog neuromorphic circuit 1100, the analog neuromorphic circuit 1000, the output configuration 500, the analog neuromorphic circuit 400, the analog neuromorphic processing device 100, the analog neuromorphic circuit 200, and the neural network configuration 300 are to be discussed in further detail.

Figure 11:
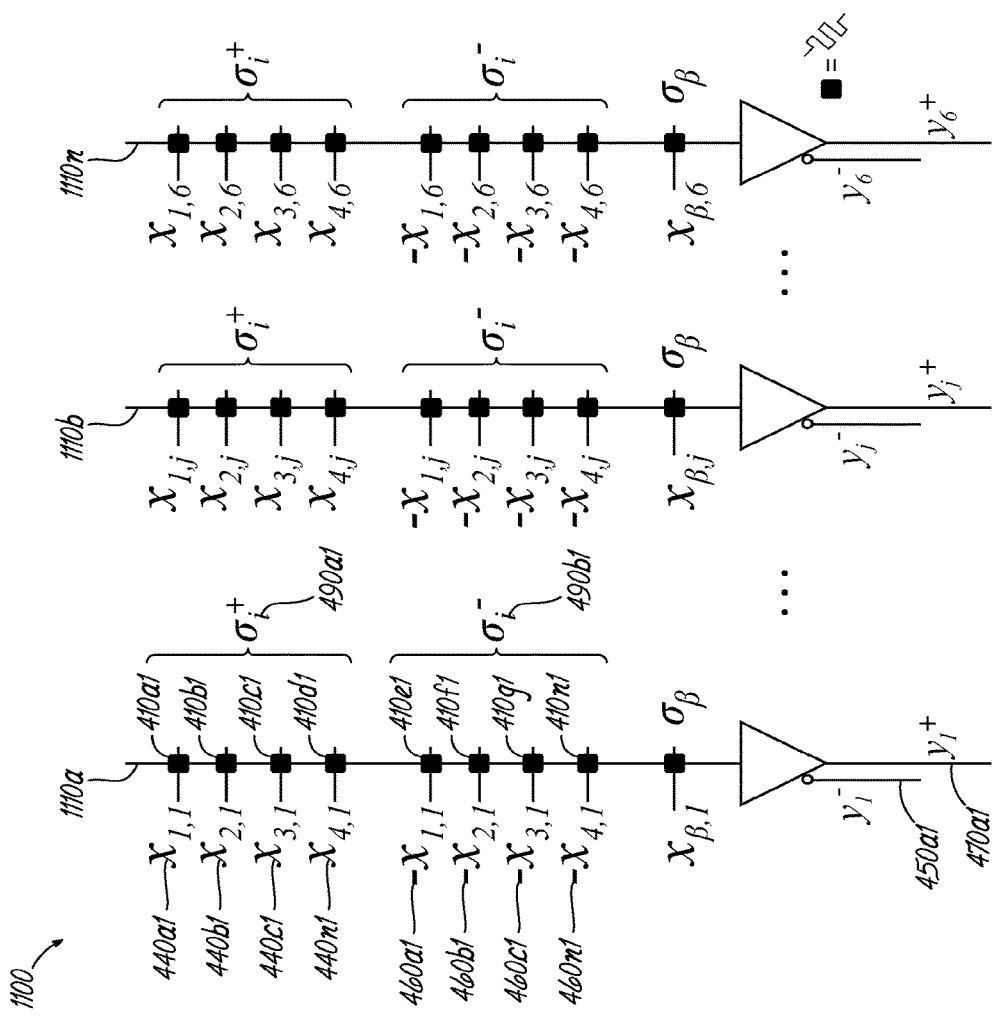
FIG. 11 is a schematic illustration of an analog neuromorphic circuit in accordance with an embodiment of the disclosure.

As discussed in the example above regarding the initial embodiment of step 920 and shown in FIG. 11, the analog neuromorphic circuit 1100 includes six different individual analog neuromorphic circuits 1110(a-n). Each 4×4 pixel section of each corresponding 24×24 pixel feature map is applied as input voltages 440(a1-nn) and complemented input voltages 460(a1-nn) to the corresponding individual analog neuromorphic circuit 1110(a-n) in order to generate the six different 12×12 reduced pixel maps. In doing so, each of the six smoothing filters may be represented via the respective resistive memories 410(a1-nn) that are included in each corresponding individual analog neuromorphic circuit 1110(a-n).

However, in a first alternative embodiment regarding step 920, each of the entire 24×24 pixel feature images may be applied to the analog neuromorphic circuit 1300 to generate the six different 12×12 reduced pixel maps. In doing so, each of the six smoothing filters may be represented by six different individual analog neuromorphic circuits 1310(a-n), where n is an integer equal to six in this example, with each individual analog neuromorphic circuit 1310(a-n) including 1153×144 resistive memories. Each of the 24×24 pixel feature maps are then reduced by eliminating the unwanted columns from the columns of the convolution kernel matrixes, $k_{exp}^+$ and $k_{exp}^-$ in Equation 23, generated in the first convolution layer presented in the first alternative embodiment of step 910 and the remaining values are then applied as inputs to each corresponding individual analog neuromorphic circuit 1310(a-n) to generate the six different 12×12 reduced pixel maps in a single cycle.

Although the above example depicts six 24×24 feature maps divided into 4×4 pixel portions and applied to a 4×4 pixel filter as depicted in Equation 18 and sampled by a factor of 2, the analog neuromorphic configuration 1300 may be modified to handle any quantity and any size of feature maps while incorporating any size filter as well as any type of filter and any factor of sampling to generate any number of reduced pixel sets that is apparent to those skilled in the art.

As noted above regarding FIGS. 9 and 12, each of the different reduced pixel maps is applied to the analog neuromorphic circuit 1200 as discussed regarding the initial embodiment of step 930, is applied as inputs to the analog neuromorphic circuit 1200 in sections. As discussed in the example above, each of the six 12×12 reduced pixel maps is applied to the analog neuromorphic circuit 1200 as inputs in 5×5 pixel sections.

Figure 14:
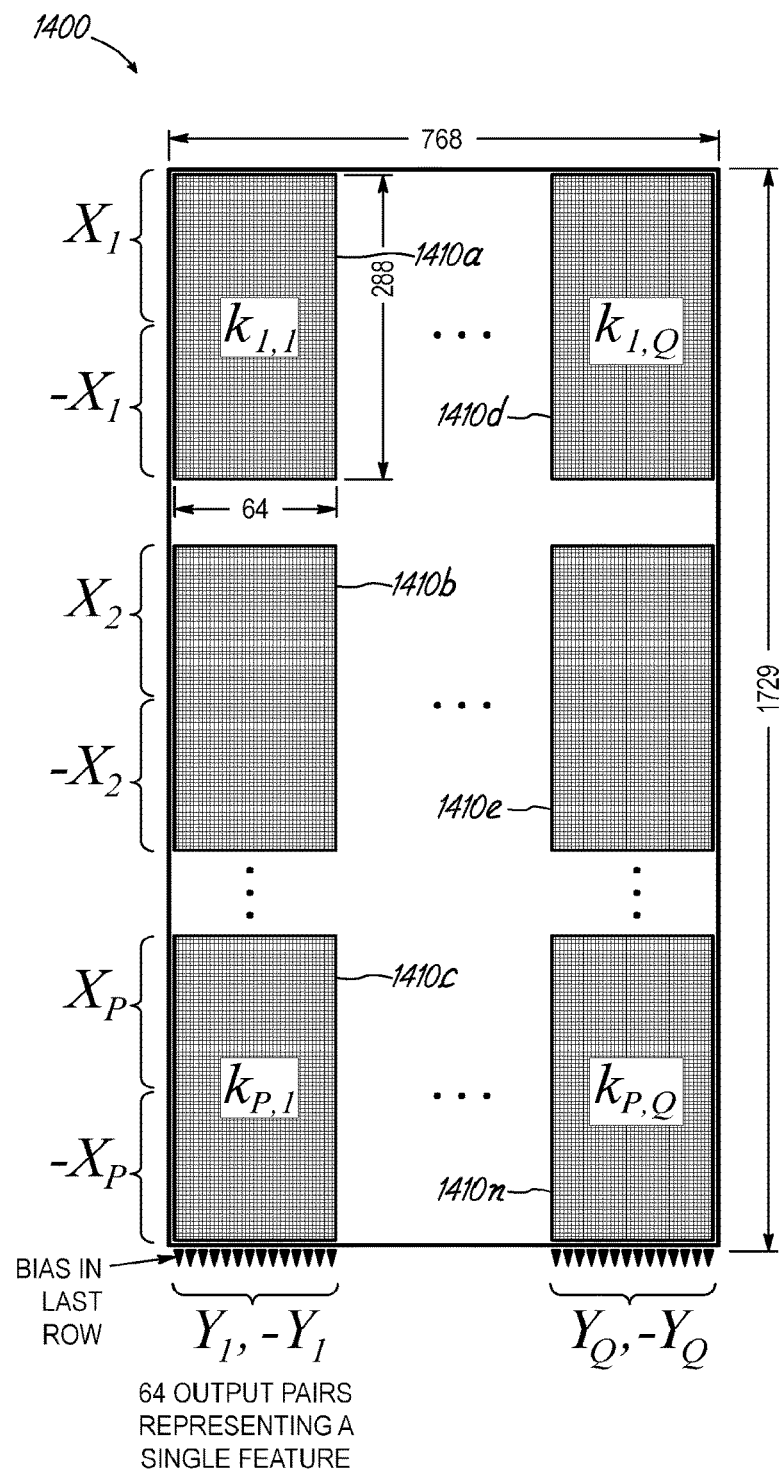
FIG. 14 is a schematic illustration of an analog neuromorphic circuit where the entire reduced pixel map may be applied as inputs without having to break each of the reduced pixel maps into sections to generate each of the output feature maps in accordance with an embodiment of the disclosure.

Rather than break each of the reduced pixel maps that are applied to the analog neuromorphic circuit 1200 as inputs into sections and then digitally store each of the output feature maps generated as outputs, the entire reduced pixel map may be applied to the analog neuromorphic circuit 1400 as depicted in FIG. 14 as inputs without having to break each of the reduced pixel maps into sections to generate each of the output feature maps. In a first alternative embodiment regarding step 930, each of the entire 12×12 pixel reduced pixel maps may be applied to the analog neuromorphic circuit 1400 and grouped according to generate twelve 4×4 pixel output feature maps. In doing so, each of the different twelve different kernels may be represented by twelve different individual analog neuromorphic circuits 1410($a$-$n$), where n is an integer equal to twelve in this example, with each individual analog neuromorphic circuit 1410($a$-$n$) including 288×64 resistive memories. The application of each feature map to the analog neuromorphic circuit 1400 in a single processing cycle without applying the reduced pixel maps in sections may also eliminate the need to digitally store each of the output feature maps until the second smoothing layer is executed.

The analog neuromorphic circuit 1400 shares many similar features with the analog neuromorphic processing device 100, the analog neuromorphic circuit 200, the neural network configuration 300, the analog neuromorphic circuit 400, the output configuration 500, the analog neuromorphic circuit 1000, the analog neuromorphic circuit 1100, the analog neuromorphic circuit 1200, and the analog neuromorphic circuit 1300, therefore, only the differences between the analog neuromorphic circuit 1400 and the analog neuromorphic circuit 1300, the analog neuromorphic circuit 1200, the analog neuromorphic circuit 1100, the analog neuromorphic circuit 1000, the output configuration 500, the analog neuromorphic circuit 400, the analog neuromorphic processing device 100, the analog neuromorphic circuit 200, and the neural network configuration 300 are to be discussed in further detail.

Although the above example depicts six 12×12 reduced pixel maps simultaneously inputted to the analog neuromorphic circuit 1400 and simultaneously multiplied by twelve different kernels generating 72 different output feature maps that are then grouped into twelve different grouped output feature maps each including six different output feature maps, the analog neuromorphic circuit 1400 may be modified to handle any quantity and any size of feature maps while incorporating any amount of kernels as well as grouping output feature maps into any quantity of groups including any quantity of output feature maps to generate any quantity of grouped output feature maps that is apparent to those skilled in the art.

As noted above regarding FIGS. 9, 12, and 13 the images that are applied to the analog neuromorphic circuits as inputs are applied without having to break the applied images into sections thereby eliminating the need for digital storage. In doing so, analog neuromorphic circuits with increased size regarding the quantity of resistive memories included in the analog neuromorphic circuits are implemented in order to accommodate the images being applied as inputs without having to break the applied images into sections. However, there may be applications where the images that are to be input into the analog neuromorphic circuits are significantly large with a significant quantity of resistive memories where incorporating such large analog neuromorphic circuits may result in error that exceeds the requirements of the design. Thus, the significantly large analog neuromorphic circuits may then be broken down into the horizontal and/or vertical direction to generate smaller analog neuromorphic circuits to simplify the analog neuromorphic circuits to decrease the error while still eliminating the need for digital storage.

Figure 15:
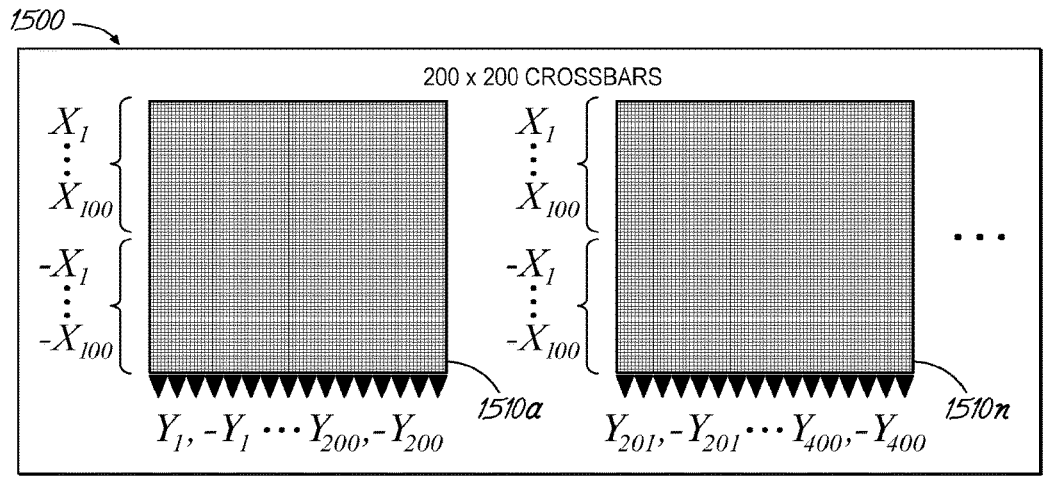
FIG. 15 is a schematic illustration of an analog neuromorphic circuit where the initial analog neuromorphic circuit is broken down horizontally into smaller analog neuromorphic circuits in accordance with an embodiment of the disclosure.

FIG. 15 depicts an analog neuromorphic circuit 1500 where the initial analog neuromorphic circuit is broken down horizontally into smaller analog neuromorphic circuits 1510$a$ and 1510$n$, where n is an integer equal to or greater than one. In splitting the initial analog neuromorphic circuit into the smaller analog neuromorphic circuits 1510($a$-$n$) in the horizontal direction, the inputs applied to the initial analog neuromorphic circuit may be applied to the smaller analog neuromorphic circuits 1510($a$-$n$) simultaneously with each of the different smaller analog neuromorphic circuits 1510($a$-$n$) generating a different set of output values. For example, as depicted in the 200×200 resistive memories of the smaller analog neuromorphic circuits 1510($a$-$n$) of FIG. 15, one hundred positive input values and one hundred negative input values are applied to both the smaller analog neuromorphic circuit 1510$a$ and the smaller analog neuromorphic circuit 1510$n$ simultaneously. However, the two hundred output values for the smaller analog neuromorphic circuit 1510$a$ differ from the two hundred output values for the smaller analog neuromorphic circuit 1510$n$. Although the above example depicts smaller analog neuromorphic circuits depicted with 200×200 resistive memories where the initial analog neuromorphic circuit is broken down horizontally into the smaller analog neuromorphic circuits, any quantity and any size of smaller analog neuromorphic circuits may be implemented in breaking down the initial neuromorphic circuit horizontally that is apparent to those skilled in the art.

The analog neuromorphic circuit 1500 shares many similar features with the analog neuromorphic processing device 100, the analog neuromorphic circuit 200, the neural network configuration 300, the analog neuromorphic circuit 400, the output configuration 500, the analog neuromorphic circuit 1000, the analog neuromorphic circuit 1100, the analog neuromorphic circuit 1200, the analog neuromorphic circuit 1300, and the analog neuromorphic circuit 1400 therefore, only the differences between the analog neuromorphic circuit 1500 and the analog neuromorphic circuit 1400, the analog neuromorphic circuit 1300, the analog neuromorphic circuit 1200, the analog neuromorphic circuit 1100, the analog neuromorphic circuit 1000, the output configuration 500, the analog neuromorphic circuit 400, the analog neuromorphic processing device 100, the analog neuromorphic circuit 200, and the neural network configuration 300 are to be discussed in further detail.

Figure 16:
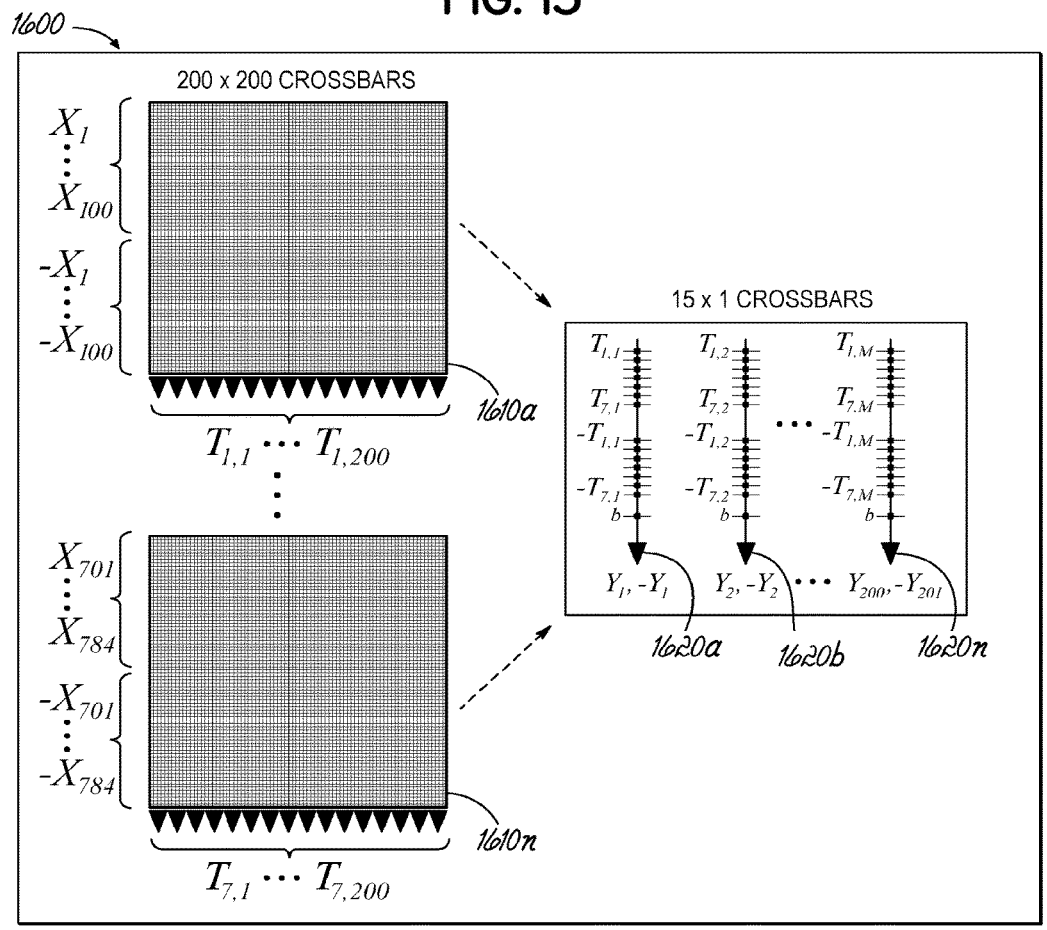
FIG. 16 is a schematic illustration of an analog neuromorphic circuit where the initial analog neuromorphic circuit is broken down vertically into smaller analog neuromorphic circuits in accordance with an embodiment of the disclosure.

FIG. 16 depicts an analog neuromorphic circuit 1600 where the initial analog neuromorphic circuit is broken down vertically into smaller analog neuromorphic circuits 1610$a$ and 1610$n$, where n is an integer equal to or greater than one. The initial analog neuromorphic circuit may be broken down vertically into the smaller analog neuromorphic circuits 1610($a$-$n$) when the number of inputs for the initial analog neuromorphic circuit spans larger than the amount of inputs for each of the smaller analog neuromorphic circuits 1610($a$-$n$). However, the analog neuromorphic circuit 1000 depicted in FIG. 10 enables the flexibility to break down the initial analog neuromorphic circuit vertically into the smaller analog neuromorphic circuits 1610($a$-$n$). For example, an initial image of 784 pixels may be applied to the smaller analog neuromorphic circuits 1610(a-n). However, the size of each of the smaller analog neuromorphic circuits 1610(a-n) is a 200×200 resistive memory configuration thereby limiting the quantity of inputs that may be applied to each of the smaller analog neuromorphic circuits 1610(a-n) to two hundred inputs. In such an example, seven different smaller analog neuromorphic circuits 1610(a-n) may be implemented in order to accommodate the 784-pixel initial image. Each of the smaller analog neuromorphic circuits 1610(a-n) may then generate two hundred different outputs.

The analog neuromorphic circuit 1600 shares many similar features with the analog neuromorphic processing device 100, the analog neuromorphic circuit 200, the neural network configuration 300, the analog neuromorphic circuit 400, the output configuration 500, the analog neuromorphic circuit 1000, the analog neuromorphic circuit 1100, the analog neuromorphic circuit 1200, the analog neuromorphic circuit 1300, the analog neuromorphic circuit 1400, and the analog neuromorphic circuit 1500, therefore, only the differences between the analog neuromorphic circuit 1600 and the analog neuromorphic circuit 1500, the analog neuromorphic circuit 1400, the analog neuromorphic circuit 1300, the analog neuromorphic circuit 1200, the analog neuromorphic circuit 1100, the analog neuromorphic circuit 1000, the output configuration 500, the analog neuromorphic circuit 400, the analog neuromorphic processing device 100, the analog neuromorphic circuit 200, and the neural network configuration 300 are to be discussed in further detail.

In such an embodiment, the smaller analog neuromorphic circuits 1610(a-n) that are incorporated into the subsampling layer may not incorporate the approximate sigmoid function as provided in Equations 15-17 while the convolution layer does incorporate the approximate sigmoid function as provided in Equations 15-17. In doing so, the approximate sigmoid function as provided in Equations 15-17 may be removed from the smaller analog neuromorphic circuits 1610(a-n) that are incorporated into the subsampling layer by setting m=1 to and b=0. The smaller analog neuromorphic circuits 1610(a-n) that are incorporated into the subsampling layer may then be implemented using Equation 25:

$$y = \sum_{i=1}^{N} x_i \sigma_i + b. \quad (25)$$

The smaller analog neuromorphic circuits 1610(a-n) that are incorporated into the convolution layer may then be implemented using Equation 26 where θ denotes the approximate sigmoid function in discussed above in Equation 17:

$$y = \theta\left(\sum_{i=1}^{N} x_i \sigma_i + b\right). \quad (26)$$

Each of the smaller analog neuromorphic circuits 1610(a-n) that do not implement the approximate sigmoid function may have each of their respective outputs provided to a corresponding output analog neuromorphic circuit 1620(a-n), where n is an integer that corresponds to the quantity of smaller analog neuromorphic circuits 1610(a-n). For example, the two hundred outputs generated by the smaller analog neuromorphic circuit 1610a may be provided to the output analog neuromorphic circuit 1620a that includes 15×1 resistive memories, the two hundred outputs generated by the smaller analog neuromorphic circuit 1610b may be provided to the output analog neuromorphic circuit 1620b that includes 15×1 resistive memories and so on.

The approximate sigmoid function may then be applied to each of the respective outputs generated by each of the output analog neuromorphic circuits 1620(a-n). In doing so, the result of the approximate sigmoid function applied to each of the respective outputs generated by each of the output analog neuromorphic circuits 1620(a-n) may be similar to the result generated when each of the 784 pixels of the initial image are applied to the analog neuromorphic circuit that is of sufficient size to handle each of the 784 pixels in a single analog neuromorphic circuit. The respective outputs generated by the output analog neuromorphic circuits 1620(a-n) may be similar to that of the outputs generated by a single analog neuromorphic circuit in that the respective outputs may be relied upon as being adequately correct as compared to the outputs generated by the single analog neuromorphic circuit.

Although the above example depicts smaller analog neuromorphic circuits depicted with 200×200 resistive memories as well as output analog neuromorphic circuits with 15×1 resistive memories where the initial analog neuromorphic circuit is broken down vertically into the smaller analog neuromorphic circuits, any quantity and any size of smaller analog neuromorphic circuits and output analog neuromorphic circuits may be implemented in breaking down the initial neuromorphic circuit vertically that is apparent to those skilled in the art.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for adjusting resistances of a plurality of resistive memories positioned in an analog neuromorphic circuit, comprising:

applying a plurality of input voltages to the analog neuromorphic circuit, wherein each input voltage represents a vector value that is a non-binary value included in a vector that is incorporated into a dot-product operation with a plurality of matrix values included in a matrix;

providing a resistance value to each corresponding input voltage from a corresponding resistive memory included in a plurality of resistive memories, wherein each resistance value is a positive resistance value selected from a finite range of resistance values;

pairing each resistive memory with another resistive memory from the plurality of resistive memories so that each pair of resistive memories includes a pair of resistance values; converting each pair of resistance values from a pair of resistance values selected from the finite range of resistance values to a single non-binary value;

mapping each single non-binary value to a matrix value included in the matrix that is incorporated into the dot-product operation with the vector values included in the vector; and generating a plurality of dot-product operation values from the dot-product operation with the vector and the matrix, wherein each dot-product operation value is a non-binary value.

2. The method of claim 1, further comprising:

mapping each positive matrix value into a first relationship with the corresponding pair of resistive memories so that the first relationship converts the corresponding pair of positive resistance values selected from the finite range of resistance values to a positive single non-binary value that represents the positive matrix value; and mapping each negative matrix value into a second relationship with the corresponding pair of resistive memories so that the second relationship converts the corresponding pair of positive resistance values selected from the finite range of resistance values to a negative single non-binary value that represents the negative weighted matrix value.

3. The method of claim 1, further comprising:

mapping each positive matrix value into a co-linear first relationship with the corresponding pair of resistive memories so that the co-linear first relationship converts a corresponding pair of conductance values selected from a finite range of conductance values to the positive single non-binary value that represents the positive matrix value; and mapping each negative matrix value into a co-linear second relationship with the corresponding pair of resistive memories so that the co-linear second relationship converts a corresponding pair of conductance values selected from the finite range of conductance values to the negative single non-binary value that represents the negative matrix value.

4. The method of claim 3, further comprising:

propagating each input voltage applied to the analog neuromorphic circuit through the plurality of resistive memories so that each resistance of each resistive memory contributes to a generation of a plurality of output voltage signals.

5. The method of claim 4, further comprising:

generating each output voltage signal from the dot-product operation of the vector and the matrix so that each output voltage signal is representative of each corresponding dot-product operation value.

6. The method of claim 5, further comprising:

converting each output voltage signal that is representative of each corresponding dot-product operation value from a voltage value to a non-binary value that is representative of the dot-product operation of the vector and the matrix.

7. The method of claim 1, wherein each resistive memory is a memristor.

8. An analog neuromorphic system that implements a plurality of resistive memories, comprising:

a plurality of input voltages applied to an analog neuromorphic circuit, wherein each input voltage represents an image value that is a non-binary value included in an image matrix that is converted into a voltage vector;

a plurality of resistive memories with each resistive memory configured to provide a resistance value to each corresponding input voltage, wherein each resistance value is mapped to a corresponding kernel value that is a non-binary value included in a kernel matrix;

a controller configured to:

convert each image value included in the image matrix into the corresponding input voltage that is included in a voltage vector, map each corresponding kernel value to a corresponding resistance value associated with a corresponding resistive memory, and generate a plurality of filtered image values from a dot-product operation with the image matrix represented by the plurality of input voltages and the kernel matrix represented by each resistance value associated with each of the resistive memories, wherein the plurality of filtered image values depicts a filtered image.

9. The analog neuromorphic system of claim 8, wherein the controller is further configured to:

pair each resistive memory with another resistive memory from the plurality of resistive memories so that each pair of resistive memories includes a pair of resistance values; and convert each pair of resistance values from a pair of positive resistance values selected from a finite range of resistance values to a single non-binary value, wherein each single non-binary value is mapped to a kernel value included in the kernel matrix that is incorporated into the dot-product operation with the image values converted into the corresponding input voltages included in the voltage vector.

10. The analog neuromorphic system of claim 9, wherein the controller is further configured to:

map each positive kernel value into a first relationship with the corresponding pair of resistive memories so that the first relationship converts the corresponding pair of positive resistance values selected from the finite range of resistance values to a positive single non-binary value that represents the positive weighted kernel value; and map each negative kernel value into a second relationship with the corresponding pair of resistive memories so that the second relationship converts the corresponding pair of positive resistance values selected from the finite range of resistance values to a negative single non-binary value that represents the negative weighted kernel value.

11. The analog neuromorphic system of claim 10, wherein the controller is further configured to:

map each positive weighted kernel value into a co-linear first relationship with the corresponding pair of resistive memories so that the co-linear first relationship converts a corresponding pair of conductance values selected from a finite range of conductance values to the positive single non-binary value that represents the positive weighted matrix value; and map each negative weighted matrix value into a co-linear second relationship with the corresponding pair of resistive memories so that the co-linear second relationship converts a corresponding pair of conductance values selected from the finite range of conductance values to the negative single non-binary value that represents the negative weighted matrix value.

12. The analog neuromorphic system of claim 11, wherein each input voltage applied to the analog neuromorphic circuit is propagated through the plurality of resistive memories so that each resistance of each resistive memory contributes to a generation of a plurality of output voltage signals.

13. The analog neuromorphic system of claim 12, wherein each output voltage signal is generated from the dot-product operation with the image matrix represented by the plurality of input voltages and the kernel matrix represented by each resistance value associated with each of the resistive memories so that each output voltage signal is representative of each corresponding filtered image value.

* * * * *